US009666362B2

(12) United States Patent
Berdy et al.

(10) Patent No.: US 9,666,362 B2
(45) Date of Patent: May 30, 2017

(54) SUPERPOSED STRUCTURE 3D ORTHOGONAL THROUGH SUBSTRATE INDUCTOR

(71) Applicant: QUALCOMM Incorporated, San Diego, CA (US)

(72) Inventors: David Francis Berdy, San Diego, CA (US); Chengjie Zuo, Santee, CA (US); Daeik Daniel Kim, San Diego, CA (US); Changhan Hobie Yun, San Diego, CA (US); Mario Francisco Velez, San Diego, CA (US); Robert Paul Mikulka, Oceanside, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/046,302

(22) Filed: Feb. 17, 2016

(65) Prior Publication Data

US 2016/0163450 A1 Jun. 9, 2016

Related U.S. Application Data

(62) Division of application No. 14/335,609, filed on Jul. 18, 2014, now Pat. No. 9,275,786.

(51) Int. Cl.
| H01F 5/00 | (2006.01) |
| H01F 41/04 | (2006.01) |
| H01F 27/28 | (2006.01) |
| H01F 27/29 | (2006.01) |
| H01F 17/00 | (2006.01) |

(Continued)

(52) U.S. Cl.
CPC ....... *H01F 41/041* (2013.01); *H01F 17/0013* (2013.01); *H01F 27/2804* (2013.01); *H01F 27/29* (2013.01); *H01L 23/5227* (2013.01); *H01L 28/10* (2013.01); *H01F 2017/004* (2013.01); *H01L 2924/0002* (2013.01)

(58) Field of Classification Search
CPC ..... H01F 27/2804; H01F 27/29; H01F 41/041
See application file for complete search history.

(56) References Cited

U.S. PATENT DOCUMENTS

| 4,080,585 | A | * | 3/1978 | Molthen | ............. | H01F 27/2804 |
| | | | | | | 336/200 |
| 4,313,151 | A | * | 1/1982 | Vranken | ................. | H01F 5/003 |
| | | | | | | 336/200 |

(Continued)

FOREIGN PATENT DOCUMENTS

| EP | 1526606 A1 | 4/2005 |
| EP | 2012389 A1 | 1/2009 |

OTHER PUBLICATIONS

International Search Report and Written Opinion—PCT/US2015/040845—ISA/EPO—Nov. 20, 2015.

*Primary Examiner* — Minh Trinh
(74) *Attorney, Agent, or Firm* — Alan Gordon; Kenneth Vu

(57) ABSTRACT

A three-dimensional (3D) orthogonal inductor pair is embedded in and supported by a substrate, and has a first inductor having a first coil that winds around a first winding axis and a second inductor having a second coil that winds around a second winding axis. The second winding axis is orthogonal to the first winding axis. The second winding axis intersects the first winding axis at an intersection point that is within the substrate.

7 Claims, 11 Drawing Sheets

(51) Int. Cl.
*H01L 49/02* (2006.01)
*H01L 23/522* (2006.01)

(56) References Cited

U.S. PATENT DOCUMENTS

| | | |
|---|---|---|
| 6,031,445 A | 2/2000 | Marty et al. |
| 7,170,384 B2 | 1/2007 | Kim et al. |
| 7,388,462 B2 | 6/2008 | Ahn et al. |
| 7,420,452 B1 | 9/2008 | Lee et al. |
| 7,667,566 B2 | 2/2010 | Hsu et al. |
| 8,405,482 B2 | 3/2013 | Cho |
| 8,686,821 B2 | 4/2014 | Chang et al. |
| 8,803,648 B2 | 8/2014 | Lo et al. |
| 9,275,786 B2 * | 3/2016 | Berdy ............... H01F 27/2804 |
| 9,363,902 B2 * | 6/2016 | Lo ..................... H01F 27/2804 |
| 2012/0146757 A1 | 6/2012 | Tsai et al. |
| 2013/0057379 A1 | 3/2013 | Klein |
| 2014/0027880 A1 | 1/2014 | Duevel et al. |
| 2016/0020013 A1 | 1/2016 | Berdy et al. |

* cited by examiner

US 9,666,362 B2

SUPERPOSED STRUCTURE 3D ORTHOGONAL THROUGH SUBSTRATE INDUCTOR

CLAIM OF PRIORITY

The present Application for Patent is a divisional of U.S. patent application Ser. No. 14/335,609, entitled "SUPERPOSED STRUCTURE 3D ORTHOGONAL THROUGH SUBSTRATE INDUCTOR," filed Jul. 18, 2014, pending, assigned to the assignee hereof, and expressly incorporated herein by reference in its entirety.

FIELD OF DISCLOSURE

The present application is generally related to inductors and radiating elements within integrated circuit devices.

BACKGROUND

Inductors can be formed or installed on integrated circuit (IC) chips for various applications. Examples include inductors in series with power rails to filter current "spikes," e.g., from rapid switching of loads, and "LC" filters comprising various interconnects of inductors and capacitors.

One known IC chip inductor is the three-dimensional or "3D" inductor, such as the FIG. 1 example related art 3D inductor 100. The related art 3D inductor 100 is substantially embedded in and supported by a substrate, which is removed from FIG. 1 for purposes of visibility. Referring to FIG. 1, the example related art 3D inductor 100 is a rectangular coil or spiral, having a "winding axis" WX, and formed of a succession of rectangular turns (visible in FIG. 1, but not separately labeled). The device is termed "3D" because the rectangular turns are formed, in part by vias (visible, with one labeled 102), having a height normal to the substrate.

The related art 3D inductor 100 can have improved performance compared to other inductor designs, such as the known, conventional spiral two-dimensional planar ("2D") inductor (not shown in FIG. 1). However, one shortcomings of the related art 3D inductor 100 includes monopolization of chip real estate, namely, each instance occupies its own volume and chip area. Another shortcoming can be constraints regarding spacing and relative orientation between adjacent instances of such 3D inductor devices. Such constraints may result from by requirements for minimizing cross-coupling.

FIG. 2 shows one example stacked two-dimensional (2D) spiral inductor 200, according to a known conventional technique. Referring to FIG. 2, the stacked 2D spiral inductor 200 includes a first, or lower 2D spiral inductor 202, supported on, for example a substrate surface (not visible in FIG.2). Overlaying the lower 2D spiral inductor 202 is a second, or upper, 2D spiral inductor 204. However, because of the respective magnetic fields of the first and second 2D spiral inductors 202 and 204, and their respective alignment, significant cross-coupling may occur. The cross-coupling may render the FIG. 2 arrangement not practical or not preferred for some applications.

FIGS. 3A and 3B show one related art configuration 300 of neighboring instances of the FIG. 1 3D inductors, is an illustrative example of such spacing and orientation constraints. Referring to related art FIG. 3A, a first 3D coil 304 is substantially embedded in and supported by the substrate 302. The first 3D coil is orientated to have a winding axis "MA." A second 3D coil 306 is also substantially embedded in the substrate 302, at a position adjacent to the position of the first 3D coil 304. The second 3D coil is oriented with its second magnetic winding axis "MB" orthogonal, or reasonably orthogonal to the winding axis MA.

FIG. 3B is a top projection, from the projection plane 1-1 of FIG. 3A, of the related art configuration 200 of neighboring instances of the FIG. 1 3D inductors. Referring to FIG. 3B, it seen that the related art configuration 300 causes area "AA" to be occupied by the first 3D coil 302, while an area "AB" is occupied by the second 3D coil 306. Negligible overlap or sharing between area AA and area AB is provided.

SUMMARY

This Summary identifies some features and is not, and is not intended to be an exclusive or exhaustive treatment description of the disclosed subject matter. Additional features and further details are found in the detailed description and appended claims. Inclusion in the Summary is not reflective of importance. Additional aspects will become apparent to persons skilled in the art upon reading the following detailed description and viewing the drawings that form a part thereof Various three-dimensional (3D) orthogonal inductor pairs are disclosed. In one example, one 3D orthogonal inductor pair can include a substrate having a substrate top surface and a substrate bottom surface, and a first inductor, supported by the substrate, and a second inductor, supported by the substrate. In one example, the first inductor includes a first coil winding, and the first coil winding may wind around a winding section of a first winding axis. The second inductor may include a second coil winding, and the second coil winding may wind around a winding section of a second winding axis. In an aspect, the second winding axis may be orthogonal to the first winding axis, and the second winding axis can intersect the first winding axis at an intersection point, wherein the intersection point can be concurrently within the winding section of the first winding axis and within the winding section of the second winding axis.

In one example having one 3D orthogonal inductor pair, the first coil winding comprises a whole turn, having a horizontal winding radius, wherein the whole turn comprises a left via and a right via, respectively arranged to pass through the center reference plane at positions symmetrically displaced, by the horizontal winding radius, from the first winding axis. The left via can have a left via top and left via bottom, the left via top being on the substrate top surface and the left via bottom being on the substrate bottom surface, and the right via can have a right via top and a right via bottom, the right via top being on the substrate top surface and the right via bottom being on the substrate bottom surface.

Various three-dimensional (3D) orthogonal superposed section (OSS) inductors are disclosed. One example 3D OSS inductor can include a substrate having a substrate top surface and a substrate bottom surface, a first port and a second port, the first port and the second port may be supported on the substrate top surface, and may include an inductor. The inductor may couple the first port to the second port, and the inductor may comprise a first inductor section and a second inductor section, the first inductor section being coupled in series with the second inductor section. In one example of one 3D OSS inductor, the first inductor section can include a first coil winding, the first coil winding may be wound around a winding section of a first winding axis, and the winding section of the first winding axis may be within the substrate. In one example of one 3D OSS inductor, the second inductor section comprises a second coil winding, and the second coil winding may be wound around a winding section of a second winding axis. In an aspect, the winding section of the second winding axis may be within the substrate, and the second winding axis may be orthogonal to the first winding axis. In one example of one 3D OSS inductor, the first winding axis can intersect the first winding axis at an intersection point, and the intersection point may be concurrently within the winding section of the first winding axis and within the winding section of the second winding axis.

Various methods for forming a three-dimensional inductor pair are disclosed. One example includes providing a substrate, the substrate having a substrate top surface and a substrate bottom surface, and forming in the substrate, in an alignment with a winding section of a first winding axis, a plurality of pairs of first coil via through holes. In one example, each pair of first coil via through holes may comprise two via through holes spaced symmetrically from the first winding axis by a first horizontal winding radius. One example can further include forming in the substrate, in an alignment with a winding section of a second winding axis, a plurality of pairs of second coil via through holes. In one example, each pair of second coil via through holes may comprise two via through holes spaced symmetrically from the second winding axis by a second horizontal winding radius. One example can include the first winding axis being orthogonal to the second winding axis, and the first winding axis may intersect the second winding axis at an intersection point, wherein the intersection point is concurrently within the winding section of the first winding axis and the winding section of the second winding axis. One example can include filling the plurality of pairs of first via through holes and the plurality of pairs of second via through holes with metal to form, respectively, a plurality of pairs of first coil vias, and a plurality of pairs of second coil vias. One example can include forming a first top metallization on the substrate top surface, the first top metallization including a first coil top offset cross trace. In one example, the first coil top offset cross trace may pass over the first winding axis and couple a top of a first via of a first pair of first coil vias to a top of a first via of a second pair of first coil vias. One example can include forming on the substrate bottom surface a first bottom metallization, the first bottom metallization including a second coil bottom cross trace. In one example, the second coil bottom cross trace may pass under the second winding axis and couple a bottom of a first via of a first pair of second coil vias to a bottom of the second via of the first pair of second coil vias. One example can include forming on the substrate top surface a second top metallization, and the second top metallization may include a second coil top offset cross trace. In one example, the second coil top offset cross trace may pass over the second winding axis and over the first coil top offset cross trace and couple a top of the second via of the first pair of second coil vias to a top of a first via of a second pair of second coil vias. One example can include forming on the substrate bottom surface a second bottom metallization, and the second bottom metallization may include a first coil bottom cross trace. In one example, the first coil bottom cross trace may pass under the first winding axis and couple a bottom of a second via of the first pair of first coil vias to a bottom of the first via of the first pair of first coil vias.

Another example method includes providing a substrate, wherein the substrate has a substrate top surface and a substrate bottom surface, and forming in the substrate, in an alignment with a winding section of a first winding axis, a plurality of pairs of first coil via through holes. In one example, each pair of first coil via through holes may comprise two via through holes spaced symmetrically from the first winding axis by a first horizontal winding radius. One example can further include forming in the substrate, in an alignment with a winding section of a second winding axis, a plurality of pairs of second coil via through holes. In one example, each pair of second coil via through holes may comprise two via through holes spaced symmetrically from the second winding axis by a second horizontal winding radius. One example can include the first winding axis being orthogonal to the second winding axis, and the first winding axis may intersect the second winding axis at an intersection point. In an aspect, the intersection point may be concurrently within the winding section of the first winding axis and the winding section of the second winding axis. One example can include filling the plurality of pairs of first coil via through holes and the plurality of pairs of second coil via through holes with metal to form, respectively, a plurality of pairs of first coil vias, and a plurality of pairs of second coil vias. One example can include forming on the substrate top surface a first top metallization, and the first top metallization may include a first coil top offset cross trace. In one example, the first coil top offset cross trace may pass over the first winding axis and couple a top of a first via of a first pair of first coil vias to a top of a first via of a second pair of first coil vias. One example can include forming on the substrate bottom surface a first bottom metallization. The first bottom metallization may include a first coil bottom cross trace, and the first coil bottom cross trace may pass under the first winding axis and couple a bottom of the first via of the first pair of first coil vias to a bottom of the second via of the first pair of first coil vias. One example can include forming on the substrate top surface a second top metallization. The second top metallization may include a second coil top offset cross trace, and the second coil top offset cross trace may pass over the second winding axis and over the first coil top offset cross trace and couple a top of the second via of the first pair of second coil vias to a top of a first via of a second pair of second coil vias. One example can include forming on the substrate bottom surface a second bottom metallization. The second bottom metallization may include a second coil bottom cross trace, and the second coil bottom cross trace may pass under the second winding axis and couple a bottom of a second via of the first pair of second coil vias to a bottom of the first via of the first pair of second coil vias.

BRIEF DESCRIPTION OF THE DRAWINGS

The accompanying drawings are presented to aid in the description of embodiments of the invention and are provided solely for illustration of the embodiments and not limitation thereof

DETAILED DESCRIPTION

Figure 1:
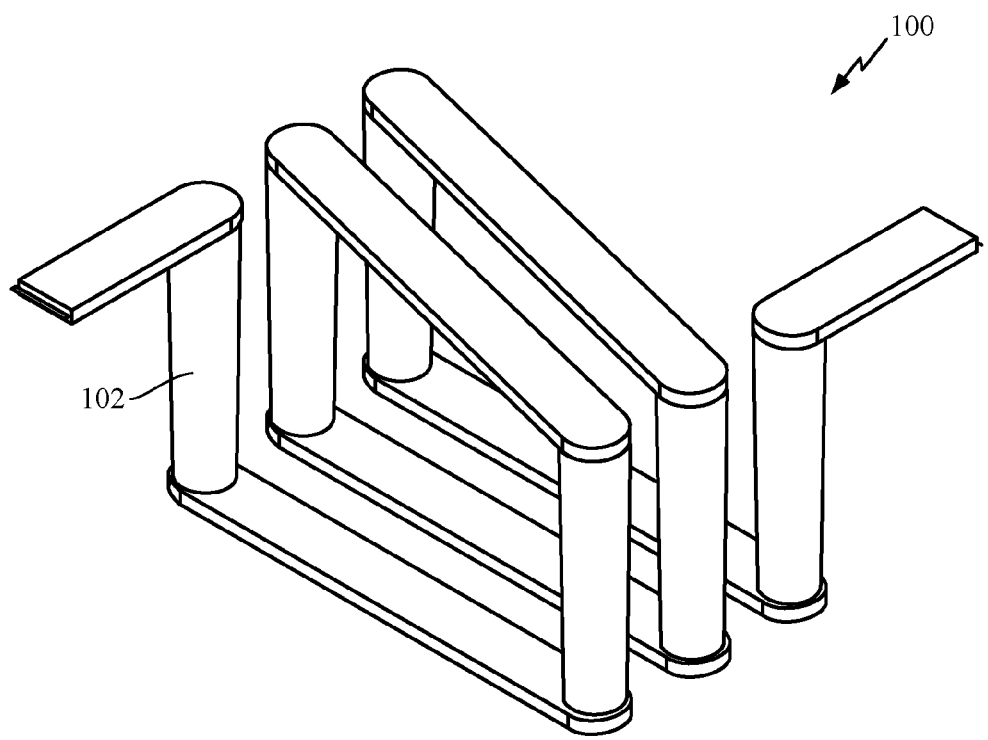
FIG. 1 is a perspective view of a related art 3D inductor.
Figure 2:
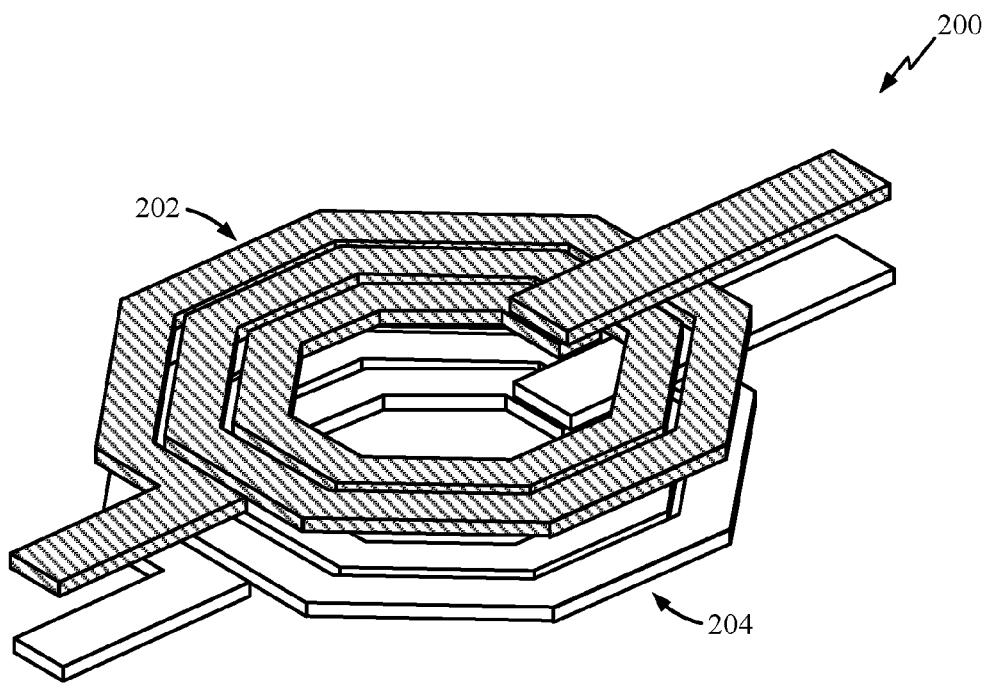
FIG. 2 a perspective view of a related art stacked arrangement of 2D inductors.

Aspects of the invention are disclosed in the following description and related drawings directed to specific exemplary embodiments. Alternate embodiments may be devised without departing from the scope of the invention. In certain described example implementations, instances are identified where various component structures and portions of operations can be taken from known, conventional techniques, and then arranged in accordance with one or more exemplary embodiments. In such instances, internal details of the known, conventional component structures and/or portions of operations are omitted to help avoid potential obfuscation of inventive concepts.

The terminology used herein is only for the purpose of describing particular embodiments and is not intended to be limiting of embodiments of the invention.

The word "exemplary," as used herein, means "serving as an example, instance, or illustration." Accordingly, the term "exemplary embodiment," as used herein, means an embodiment serving as an example, instance, or illustration, but that is not necessarily preferred or advantageous over other embodiments. Likewise, it will be understood that the term "embodiments of the invention," as used herein in reference to a feature, advantage or mode of operation, does not mean that all embodiments of the invention include the discussed feature, advantage or mode of operation.

As used herein, the singular forms "a", "an" and "the" are intended to include the plural forms as well, unless the context clearly indicates otherwise. The terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Certain embodiments are described in terms of operations and steps, for example, in or relating to various processes of design and fabrication. It will be understood, that except in instances where explicitly stated or where made clear from a particular context, that the described order of such operations and steps is only for purposes of example, and is not necessarily limiting of the order of operations or steps that may be applied in practices according to various exemplary embodiments Further, certain embodiments are described in terms of operations, steps, actions and sequences of operations, steps and actions that can performed by or under control of, for example, a computing device or elements of a computing device. It will be understood by persons of ordinary skill, upon reading this disclosure, that such operations, steps, actions, sequences and other combinations therefore can be performed by, or under control of specific circuits (e.g., application specific integrated circuits (ASICs)), by program instructions being executed by one or more processors, or by a combination of both.

Accordingly, it will be appreciated by such persons that operations, steps, actions, sequences and other combinations thereof can be embodied entirely within any form of computer readable storage medium having stored therein a corresponding set of computer instructions that, upon execution, can cause an associated processor to perform, directly or indirectly, operations, steps, actions, sequences and other combinations described herein. Thus, the various aspects of the invention may be embodied in a number of different forms, all of which are contemplated to be within the scope of the claimed subject matter.

Throughout this disclosure, the term "pad" means a conducting structure disposed on a described surface, having a substrate thickness within a range including, but not limited to, the range of thickness encompassed by structures within the ordinary and customary meaning of "pad" within the integrated circuit (IC) and IC packaging arts.

The phrases "substrate top surface" and "substrate bottom surface," when used in describing a substrate, assumes the substrate has two major supporting surfaces, parallel and facing away in opposite directions, and "substrate top surface" is the assigned name of one, and "substrate bottom surface" is the assigned name of the other.

Except where explicitly stated otherwise, the phrases "substrate top surface" and "substrate bottom surface" imply no structural difference, no difference in respective function, and no particular spatial orientation with respect the earth or any other external reference.

Except where explicitly stated otherwise or where made clear from its context to have a different meaning, the phrase "substrate surface" is a generic reference that means "substrate top surface or substrate bottom surface."

The phrase "bottom surface," when used in describing a surface of a structure relative to a substrate surface, means a surface of the structure against or otherwise facing toward the substrate surface. As illustration, if structure "A" is, for example, a metal trace or contact pad supported on a substrate top surface, then a "bottom surface" of A is a surface of A facing, i.e., contacting or spaced from but facing toward, the substrate top surface. Likewise, if that structure A is supported on a substrate bottom surface, then a "bottom surface" of A is a surface of A facing, i.e., contacting or spaced from but facing toward, the substrate bottom surface.

The phrase "top surface," when used in describing a surface of a structure relative to a substrate surface, means a surface of the structure facing opposite its bottom surface.

The phrases "A is over B" and "A is above B" are used interchangeably in describing a position of A relative to B with respect to a substrate surface, and each means that a bottom surface of A contacts or otherwise faces toward a top surface of B.

The phrase "A passes over B," when used in describing a relative arrangement and position of a metal trace A and a metal trace B with respect to a substrate surface, means that an area of a bottom surface of the metal trace A contacts or otherwise faces toward an area of a top surface of the metal trace B, and implies no inherent limitation on other regions of the metal trace A or the metal trace B.

In example apparatus according to one exemplary embodiment, three-dimensional (3D) orthogonal superposed inductor pair can be provided. For brevity, the phrase "3D orthogonal superposed" will be recited, alternatively, in an abbreviated form "3D OTS." It will be understood that the phrase "3D OTS" has no meaning within this disclosure other than an abbreviation of "3D orthogonal superposed."

One example 3D OTS inductor pair according to one or more exemplary embodiments may include a substrate having a substrate top surface and a substrate bottom surface. For brevity, the phrase "3D OTS inductor pair according to one or more exemplary embodiments" will be recited, alternatively, in abbreviated form, as "3D OTS inductor pair." The substrate may comprise, without limitation, silicon dioxide. The substrate may support other circuitry. The substrate top surface may be spaced apart from the substrate bottom surface by a substrate thickness, in a thickness direction.

In an aspect, one example 3D OTS inductor pair can include a first inductor having a first coil and a second inductor having a second coil. In an aspect, the first coil and the second coil may each have portions of their respective structures embedded in the substrate, portions embedded in and supported on the substrate top surface, and portions supported on the substrate bottom surface. As will be described in greater detail in later sections of this disclosure, in an aspect one 3D OTS inductor pair can embody a 3D structure for the first coil, and a 3D structure for the second coil, with the respective 3D structures having a cooperative 3D superposed configuration relative to one another.

In an aspect the first coil of one example 3D OTS inductor pair may be formed of windings, which will be referenced as "first coil windings," that wind around a first winding axis. The first coil windings may be positioned to wind around a linear region of the first winding axis that will be referenced as "the winding section of the first winding axis." In an aspect, the first winding axis may extend in a center reference plane, which may extend within the substrate between the substrate top surface and the substrate bottom surface. The center reference plane may be normal to the thickness direction. In an aspect, the second coil of one example 3D OTS inductor pair may be formed of windings, which will be referenced as "second coil windings," that wind around a second winding axis. The second coil windings may be positioned to wind around a linear region of the second winding axis that will be referenced as "the winding section of the second winding axis." In an aspect, the second winding axis of one example 3D OTS inductor pair may extend in the same center reference plane in which the first winding axis extends.

In an aspect, the second winding axis in one example 3D OTS inductor pair may intersect the first winding axis at an intersection point. In another aspect, the intersection point may be within the winding section of the first winding axis and, concurrently, within the winding section of the second winding axis.

As will be appreciated, the first coil windings and the second coil windings being oriented and configured as disclosed, such that the intersection point of their respective first winding axis and second winding axis is concurrently within their respective winding sections, can provide a particular cooperative 3D superposition of the first coil windings and the second coil windings.

Among other features and benefits provided by the 3D OTS inductor pair can be a high-percentage sharing of occupied volume. For example, as will be further understood upon reading this disclosure, practices can provide a first coil and an orthogonal second coil, with only a 30% increase in a volume and chip area that would occupied by the first coil (or the second coil) standing alone.

Figure 3A:
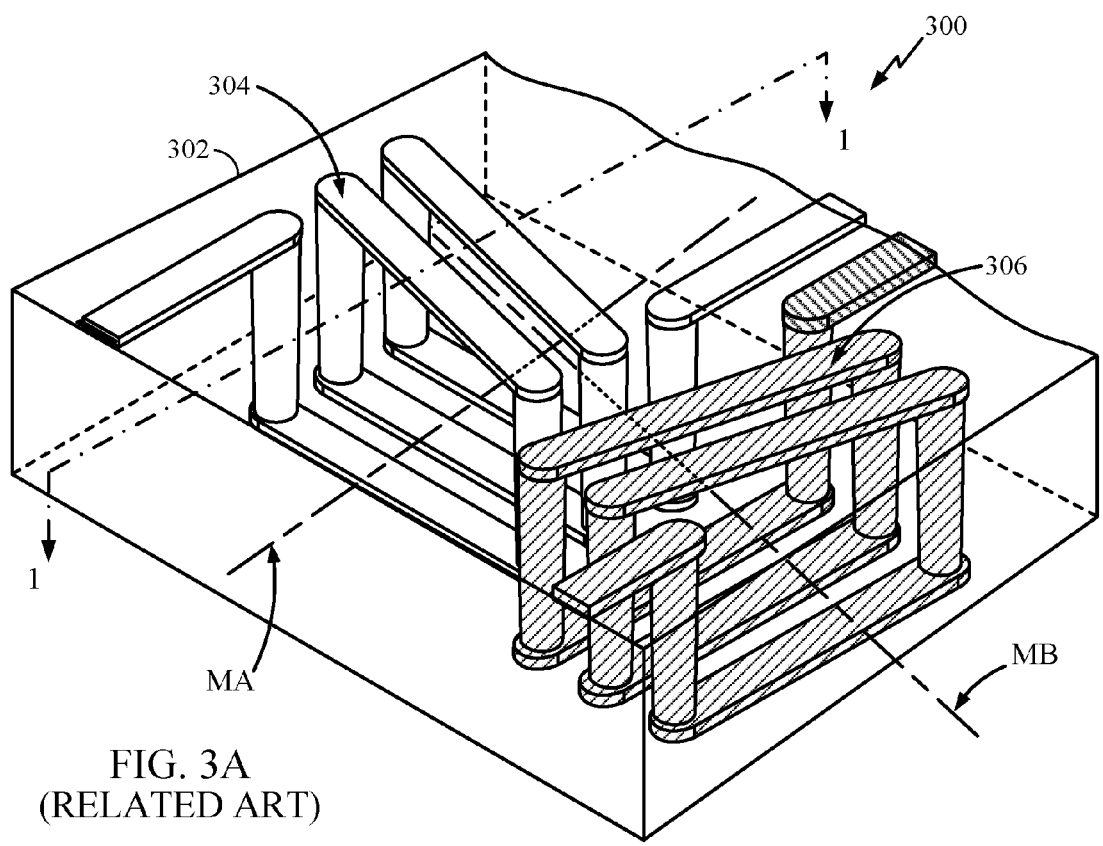
FIG. 3A is a perspective view of a related art 3D orthogonal inductor pair.
Figure 3B:
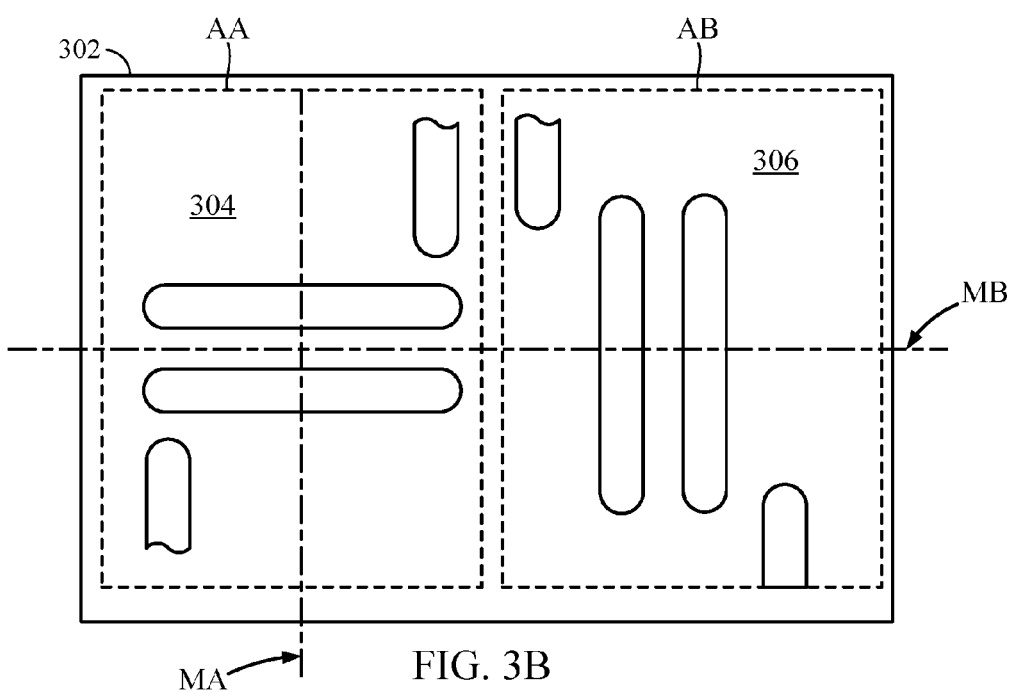
FIG. 3B is a plan view, from the FIG. 3A projection 1-1.

Additional features and benefits that may be provided by the 3D OTS inductor pair can be a unique combination of a compactness that includes sharing common substrate volume while, at the same time, having orthogonal magnetic coupling directions. For example, comparing the example 3D OTS inductor pair with the related art orthogonal 3D inductors of FIGS. 3A and 3B, this compactness and orthogonal magnetic coupling direction can provide an approximate doubling of effective device density, without any substantive increase in coupling.

In an aspect, one example 3D OTS inductor pair can have a configuration of the first coil wherein the first coil windings comprise at least a whole turn. In a further aspect, the whole turn may be a first whole turn and the first coil may include a second whole turn. This is only one example, though, and not a limitation. In an aspect, each whole turn of the first coil may include a left via and a right via. For ease of describing examples, the left via and the right via will be referred to as a "first coil left via" and a "first coil right via." The first coil left via may have a via top and a via bottom, which will be referred to as a "first coil left via top" and a "first coil right via bottom." The first coil left via top may be on the substrate top surface and the first coil left via bottom on the substrate bottom surface. Likewise, the first coil right via may have a first coil right via top and a first coil right via bottom, disposed respectively on the substrate top surface and substrate bottom surface. In an aspect, the first coil whole turn may further comprise a first coil bottom cross trace supported on the substrate bottom surface and that extends linearly from the first coil left via bottom to the first coil right via bottom. The first coil whole turn may also include a first coil top offset cross trace that extends linearly from the first coil right via top to a first coil whole turn termination pad, which may also be on the substrate top surface. In an aspect, the first coil whole turn termination pad may have a position that, projected onto the center reference plane, can be spaced by the first horizontal winding radius from the first winding axis. In a related aspect, the first coil whole turn termination pad may be spaced from the top of the first coil left via, in a direction parallel to the first winding axis, by a first coil pitch distance.

In an aspect, each whole turn of the first coil windings 3D OTS inductor pair may have a horizontal winding radius and a vertical winding radius. In a further aspect, the horizontal winding radius may be determined by the distance the first coil left via and the first coil right via are displaced from the first winding axis. Stated differently, in an aspect, in one example 3D OTS inductor pair, the first coil left via and the first coil right via may be respectively arranged to pass through the center reference plane at positions symmetrically displaced, by the horizontal winding radius, from the first winding axis. The vertical winding radius may be determined, or set, by the height of the first coil left via and first coil right via. In an aspect, offset cross conductors, described later in further detail, connecting first coil left via tops and first coil right via tops may be disposed on the substrate top surface, and cross conductors, also described later in further detail, connecting first coil left via bottoms and first coil right via bottoms may be disposed on the substrate bottom surface. Further to this aspect, the vertical winding radius may be approximately one-half the substrate thickness.

As will be understood by persons of ordinary skill, specific values for the vertical winding radius and the horizontal winding radius can be application specific. Persons of ordinary skill in the art, though, applying basic electrical engineering knowledge possessed by such persons, e.g., use of HSPICE and equivalent simulation tools, to the present disclosure can determine, or set bounds on the vertical winding radius and the horizontal winding radius, without undue experimentation. Further detailed description of selecting the vertical winding radius and the horizontal winding radius is therefore omitted.

It will be understood that the reference labels of "left" and "right", in the context of describing the first left via and the first coil right via of a whole turn of the first coil of an example 3D OTS inductor pair, are only for purposes of referencing first coil vias on one side of the first winding axis, as opposed to first coil vias on the opposite side of the first winding axis. The assignment of which side is "left" and which side is "right" is only a naming convention, and can be arbitrary.

In an aspect, the second coil of one example 3D OTS inductor pair may also comprise at least a whole turn. Accordingly, the whole turn of the first coil will be referred to as a first coil whole turn, the horizontal winding radius of the first as a first coil horizontal winding radius, the left via as a first coil left via, and the right via as a first coil right via.

In a further aspect, a whole turn of the second coil will be referred to as a second coil whole turn. The second coil whole turn may have a second coil horizontal winding radius, and a second coil vertical winding radius. In an aspect, the second coil vertical winding radius may be approximately the same as first coil vertical winding radius. In another aspect, second coil cross connectors on the substrate top surface may be spaced above the substrate top surface by a distance substantially different than second coil cross connectors are spaced above the top surface, e.g., by different thickness of dielectric films. Similarly, second coil cross connectors on the substrate bottom surface may be spaced above (i.e., away from) the substrate bottom surface by a distance substantially different than the second coil cross connectors are spaced above the bottom surface, e.g., by different thickness of dielectric films. According to these and other aspects, the second coil vertical winding radius may be different than the first coil vertical winding radius.

In an aspect, the second coil whole turn may comprise a second coil left via and a second coil right via, respectively arranged to pass through the center reference plane at positions symmetrically displaced, by the second horizontal winding radius, from the second winding axis. In an aspect, the second coil whole turn may further comprise a second coil bottom cross trace supported on the substrate bottom surface and that extends linearly from the second coil left via bottom, under the second coil winding axis, to the second coil right via bottom. The second coil may include a second coil top offset cross trace that extends linearly from the top of the second coil right via, across and over the second winding axis, to a second coil second whole turn termination pad. The second coil second whole turn termination pad may also be on the substrate top surface. In an aspect, the second coil second whole turn termination pad may have a position that, projected onto the center reference plane, can be spaced by the second horizontal winding radius from the second winding axis. In a related aspect, the second coil second whole turn termination pad may be spaced from the top of the second coil left via, in a direction parallel to the second winding axis, by a second coil pitch distance.

Figure 4A:
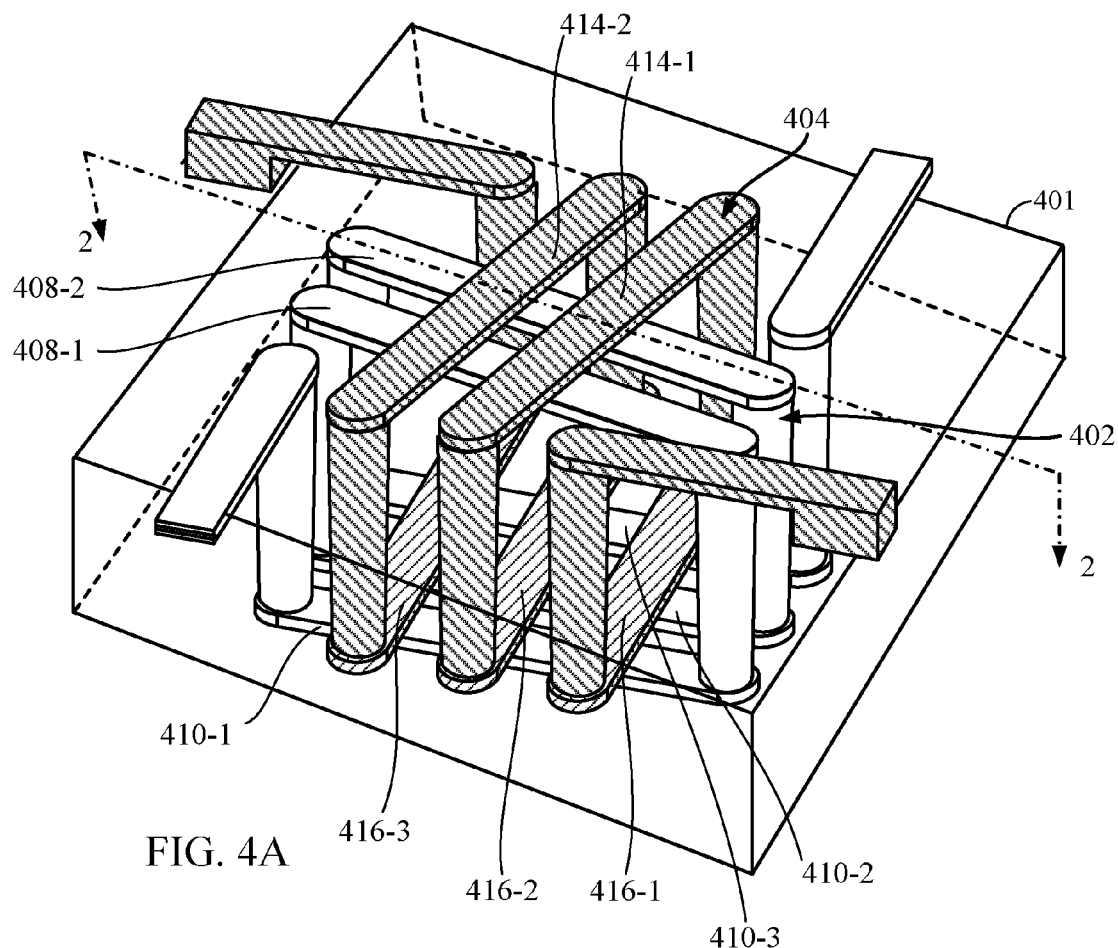
FIG. 4A is a perspective view, with a substrate rendered transparent for visibility, of one example orthogonal superposed 3D inductor pair according to one or more exemplary embodiments.

FIG. 4A shows a perspective view of one example 3D orthogonal inductor pair 400 according to one or more exemplary embodiments. Referring to FIG. 4A, the 3D orthogonal inductor pair 400 can include a superposed 3D configuration of a first inductor coil 402 and a second inductor coil 404, each embedded in, and supported by a substrate 401 (rendered partially transparent in FIG. 4A). The substrate 401 may be form formed of, but is not limited to, silicon.

Figure 4B:
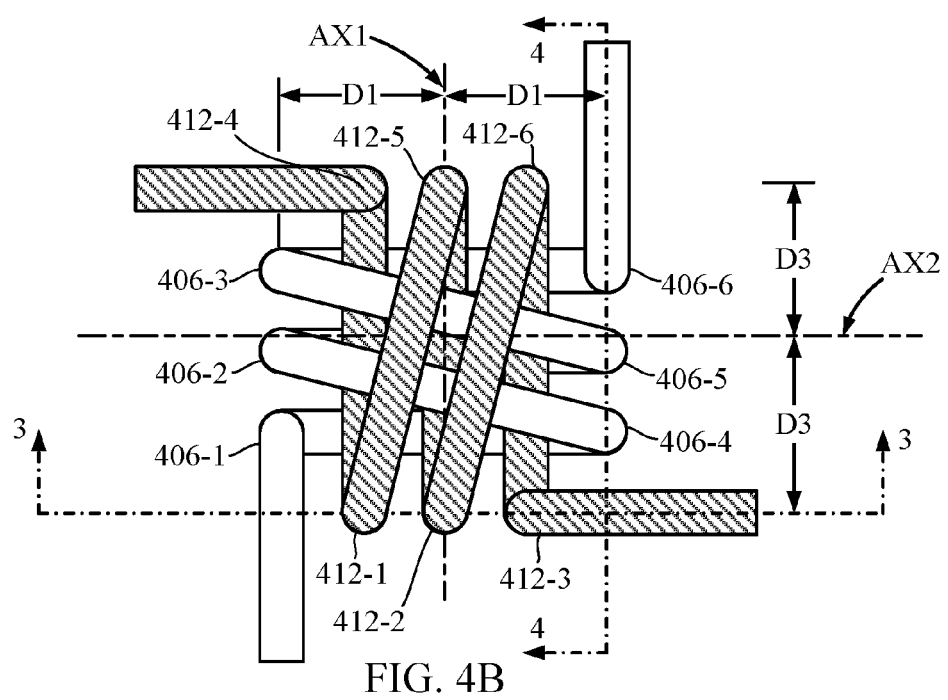
FIG. 4B is top view, from the FIG. 4A projection 2-2, with the substrate rendered transparent for visibility, of the example orthogonal superposed 3D inductor pair according to one or more exemplary embodiments.

Referring to FIGS. 4A and 4B, a structure of the first inductor coil 402 can include a plurality of vias, such as the six examples individually labeled, on FIG. 4B, as 406-1, 406-2 . . . 406-6 (collectively referenced as "first coil vias" 406). In an aspect, tops of the first coil vias 406 can be connected in a particular configuration by a plurality of first coil top offset cross traces, such as the two individually labeled examples 408-1 and 408-2. In a related aspect, the first coil vias 406 can be connected pair-wise by a plurality of first coil bottom cross traces, such as the three individually labeled examples 410-1, 410-2 and 410-3. It will be understood that except where otherwise explicitly stated, or explicitly made from the context, that "via" and "vias" mean "conducting via" and "conducting vias," respectively.

For convenience in description, the first via 406-1 will be alternatively referred to as the "first coil first left via" 406-1, the first via 406-4 as the "first coil first right via" 406-4, the first via 406-2 as the "first coil second left via" 406-2, and the first via 406-5 as the "first coil second right via" 406-5. Likewise, the first via 406-3 will be alternatively referred to as the "first coil third left via" 406-3, and the first via 406-6 as the "first coil third right via 406-6. For similar reasons, the first coil top offset cross trace 408-1 will be alternatively referred to as the "first coil first top offset cross trace" 408-1, the first coil top offset cross trace 408-2 as the "first coil second top offset cross trace" 408-2. The first coil bottom cross trace 410-1 will be alternatively referred to as the "first coil first bottom cross trace" 410-1, the first coil bottom cross trace 410-2 as the "first coil second bottom cross trace" 410-2, and the first coil bottom cross trace 410-3 as the "first coil third bottom cross trace" 410-3.

Continuing to refer to FIG. 4A, structure of the second inductor coil 404 can include a plurality of second vias, such as the six examples that are individually labeled 412-1, 412-2 . . . 412-6 (collectively referenced as "second coil vias" 412). In an aspect, the second coil vias 412 can be connected in a particular configuration by a plurality of second coil top offset cross traces, such as the two individually labeled examples 414-1 and 414-2, and plurality of second coil bottom cross traces, such as the three individually labeled examples 416-1, 416-2 and 416-3.

For convenience in description, the second coil via 412-1 will be alternatively referred to as the "second coil first left via" 412-1, the second coil via 412-4 as the "second coil first right via" 412-4, and the second coil via 412-2 as the "second coil second left via" 412-2. Likewise, the second coil via 412-5 will be alternatively referred to as the "second coil second right via" 412-5, the second coil via 412-3 as the "second coil third left via" 412-3, and the second coil via 412-6 as the "second coil third right via" 412-6. Continuing, the second coil top offset cross trace 414-1 will be alternatively referred to as the "second coil first top offset cross trace" 414-1, and the second coil top offset cross trace 414-2 as the "second coil second top offset cross trace" 414-2. In addition, the second coil bottom cross trace 416-1 will be alternatively referred to as the "second coil first bottom cross trace" 416-1, the second coil bottom cross trace 416-2 as the "second coil second bottom cross trace" 416-2, and the second coil bottom cross trace 416-3 as the "second coil third bottom cross trace" 416-3.

Figure 4C:
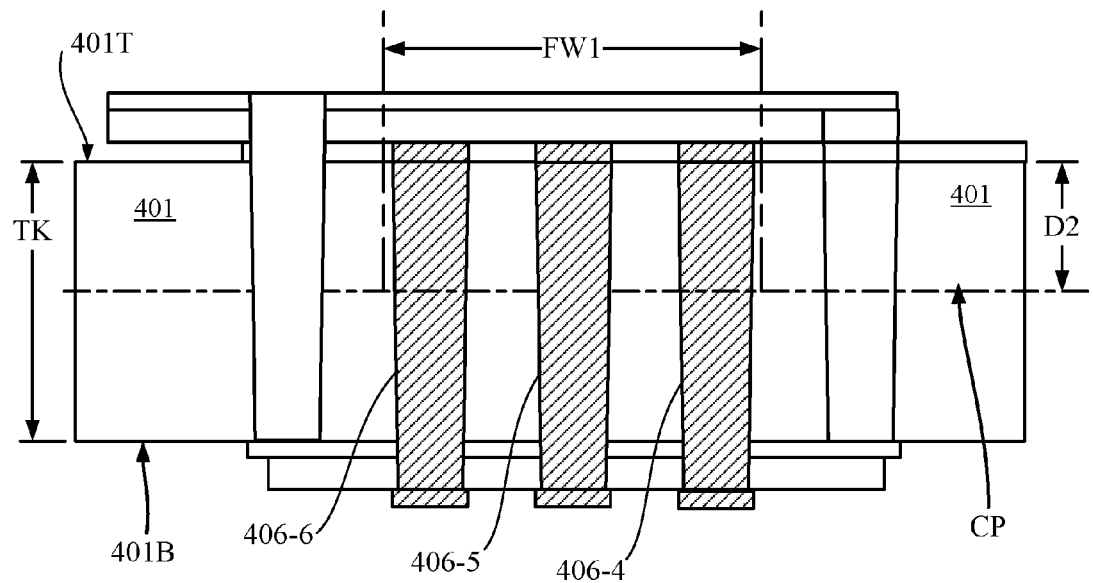
FIG. 4C is a side projection view, on the FIG. 4B cut-plane 3-3, of the example orthogonal superposed 3D inductor pair according to one or more exemplary embodiments.
Figure 4D:
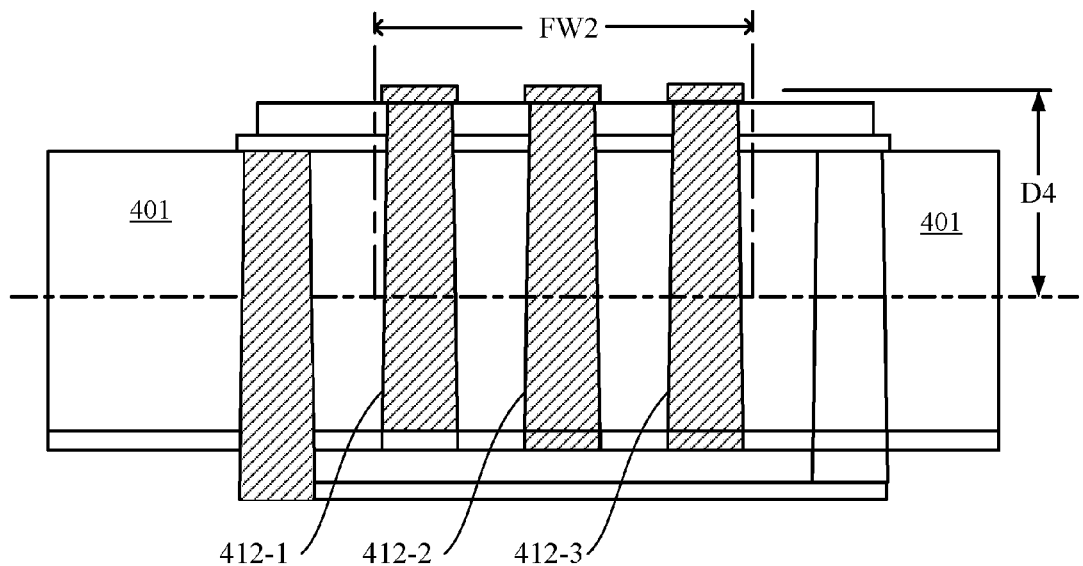
FIG. 4D is a side projection view, on the FIG. 4B cut-plane 4-4, of the example orthogonal superposed 3D inductor pair according to one or more exemplary embodiments.

FIG. 4B is a top view of the 3D orthogonal inductor pair 400, from the FIG. 4A projection plane 2-2. FIG. 4C is a projection view of the 3D orthogonal inductor pair 400, from the FIG. 4B cut-plane 3-3. FIG. 4D is a projection view of the 3D orthogonal inductor pair 400, from the FIG. 4B cut-plane 4-4.

Referring to FIG. 4C, the substrate 401 can have a substrate top surface 401T and a substrate bottom surface 402B. The substrate top surface 401T may be spaced from the substrate bottom surface 401P by a substrate thickness, labeled TK, in a thickness direction TD. A center reference plane CP can extend through the substrate between the substrate top surface 401T and the substrate bottom surface 401B.

Referring to FIGS. 4A and 4B, the first inductor coil 402 is formed by the first coil vias 406, the first coil top offset cross traces 408 and the first coil bottom cross traces 410. The first inductor coil 402 may have coil windings (shown, but not separately labeled) that may wind around a first winding axis AX1. Referring to FIGS. 4B and 4C, in an aspect the first winding axis AX1 can extend in the center reference plane CP. In another aspect (not shown in FIGS. 4A-4B), the first winding axis AX1 may extend parallel to, but either above or below the center reference plane CP. For example, in one embodiment, the first coil top offset cross traces 408 can have a first spacing (not explicitly visible in FIGS. 4A-4B) above the substrate top surface 401T, while first coil bottom cross traces 410 can have a second spacing (not explicitly visible in FIGS. 4A-4B) above (meaning away from) the substrate bottom surface 401B. Referring to FIG. 4C, the first coil windings, portions of which are formed by the first coil fourth via 406-4, first coil fifth via 406-5, and the first coil sixth via 406-6 are arranged to wind around a winding section FW1 of AX1.

With continuing reference to FIGS. 4A and 4B, in the 3D orthogonal inductor pair 400, the second inductor coil 404 can be embedded in and supported by the substrate 401. The second inductor coil 404 may comprise second inductor coil windings (visible but not separately numbered), formed by the illustrated arrangement of the second coil vias 412, the first coil top offset cross traces 414 and the first coil bottom cross traces 416, described later in further detail. As will be understood, portions of the second inductor windings are formed by the second coil fourth via 412-4, second coil fifth via 412-5, and the second coil sixth via 412-6.

Referring to FIG. 4B, in an aspect, the second inductor coil windings may wind around a second winding axis, which is shown in FIG. 4B as "AX2." Referring to FIG. 4B, in an aspect, AX2 can be orthogonal to AX1. In an aspect, AX2 may extend in the same plane as AX1, e.g., both in the center reference plane CP. Referring to FIG. 4D, in an aspect, the second inductor coil windings, portions of which are formed by the second coil fourth via 412-4, second coil fifth via 412-5, and the second coil sixth via 412-6 are arranged to wind around a winding section FW2 of the second winding axis (hidden within the center reference plan RP).

Referring to FIGS. 4B, 4C and 4D, in an aspect, AX2 may intersect AX1 at an intersection point "IP." In accordance with various exemplary embodiments, the intersection point IP may be concurrently within the winding section FW1 of AX1 and the winding section FW2 of AX2. As will be appreciated, this arrangement can provide substantial co-location, i.e., 3D superposition, of the winding section FW1 of AX1, around which the first inductor coil 402 is wound, and the winding section FW2 of AX2, around which the second inductor coil 404 is wound.

Referring to FIGS. 4A, 4B and 4C, in an aspect, the first inductor coil 402 may include at least one whole turn, having a first coil horizontal winding radius, shown in FIG. 4B as "D1," and a first coil vertical winding radius, shown in FIG. 4C as "D2." In an aspect, the first coil vertical winding radius D2 may be equal to the first coil horizontal winding radius D1. In another aspect, the first coil vertical winding radius D2 may be greater than or less that the first coil horizontal winding radius D1. In an aspect, the first coil vertical winding radius D2 may be approximately one-half the substrate thickness TK. In another aspect, structure (in an arrangement not explicitly visible in FIGS. 4A-4B) of the first inductor coil 402 may be spaced above the substrate top surface 401T, and other structure of the first inductor coil 402 may be spaced above (meaning away from) the substrate bottom surface 401B. It will be appreciated that such spacing can provide a first coil vertical winding radius D2 greater than one-half of TK.

In an aspect, one example whole turn of the first coil can include one pair of first coil vias 406, for example, the first coil first left via 406-1 and the first coil first right via 406-4, in combination with the first coil first bottom cross-trace 410-1 and the first coil first offset top cross-trace 408-1. This example whole turn can be termed a "first inductor coil first whole turn" (visible, but not separately labeled), and its described one pair of first coil vias can be termed a "first pair of first coil vias." The first inductor coil first whole turn can pass from the top to the bottom of the first coil first left via 406-1, then across and under AX1 through the first coil first bottom cross-trace 410-1 to the bottom, and then upward to the top of the first coil first right via 406-4. Continuing, the first inductor coil first whole turn can pass back across and over AX1, through the first coil first offset top cross-trace 408-1. The first inductor coil 402 can also include a second whole turn (visible, but not separately labeled) in series with the above-described first whole turn, which may be termed a "first inductor coil second whole turn" (visible, but not separately labeled). The first inductor second whole turn can include a second pair of first coil vias 406, immediately adjacent (in the direction of AX1) the first pair of first coil vias 406 described as structure for the first coil first whole turn. The second pair of first coil vias may comprise, for example, the first coil second left via 406-2, and the first coil second right via 406-4. The first inductor second whole turn may include, for example, the second pair of first coil vias, i.e., the first coil second left via 406-2, and the first coil second right via 406-4, in combination with the first coil second bottom cross-trace 410-2 and the first coil second offset top cross-trace 408-2. The example first inductor coil second whole turn can pass from the top to the bottom of the first coil second left via 406-2, then across and under AX2 through the first coil second bottom cross-trace 410-2 to the bottom of the first coil second right via 406-4. Continuing, the first inductor second whole turn can pass from the bottom to the top of the first coil second right via 406-5, then across and over AX1 through the first coil second offset top cross-trace 408-2.

Referring to FIGS. 4A-4B, the first inductor coil 402 can also include a partial turn (visible, but not separately labeled) in series with the above-described first inductor coil first whole turn and first inductor coil second whole turn. This partial turn, may be termed a "first inductor coil partial turn" (visible, but not separately labeled). The first inductor partial turn can include a third pair of first coil vias 406, immediately adjacent (in the direction of AX1) the pair of first coil vias 406 described as structure for the first coil second whole turn. The third pair of first coil vias may comprise, for example, the first coil third left via 406-3 and the first coil third right via 406-6. The first inductor coil partial turn may include, for example, the third pair of first coil vias, i.e., the first coil third left via 406-3 and the first coil third right via 406-6, and the first coil third bottom cross-trace 410-3. The example first inductor coil partial turn can pass from the top to the bottom of the first coil third left via 406-3, then across and under AX1 through the first coil third bottom cross-trace 410-3 to the bottom of, and then upward to the top of the first coil third right via 406-6.

Referring to FIGS. 4A, 4B and 4C in an aspect, the second inductor coil 404 may include at least one whole turn, having a second coil horizontal winding radius, shown in FIG. 4B as "D3" and a second coil vertical winding radius, shown in FIG. 4D as "D4." In an aspect, the second coil vertical winding radius D4 may be equal to the second coil horizontal winding radius D3. In another aspect, the second coil vertical winding radius D4 may be greater than or less that the second coil horizontal winding radius D3. In an aspect, the second coil vertical winding radius D4 may be greater than, equal to, or less than the first coil vertical winding radius D2.

In an aspect, one example whole turn of the second inductor coil 404 can include one pair of second coil vias 412, for example, the second coil first left via 412-1, and the second coil first right via 412-4, in combination with the second coil first bottom cross-trace 416-1 and the second coil first offset top cross-trace 414-1. This example whole turn can be termed a "second inductor coil first whole turn" (visible, but not separately labeled), and its described one pair of second coil vias can be termed a "first pair of second coil vias." The example second inductor coil first whole turn can pass from the top to the bottom of the second coil first left via 412-1, then across and under AX2 through the second coil first bottom cross-trace 416-1 to the bottom, and then upward to the top of the second coil first right via 416-4. This example second inductor coil first whole turn can end by extending back across and over AX2, through the second coil first offset top cross-trace 414-1. The second inductor coil 404 can also include a second whole turn (visible, but not separately labeled) in series with the above-described first whole turn, which may be termed a "second inductor coil second whole turn" (visible, but not separately labeled). The second inductor second whole turn can include a second pair of second coil vias 412, immediately adjacent (in the direction of AX2) the pair of second coil vias 412 described as structure for the second coil first whole turn. The second pair of second coil vias may comprise, for example, the second coil second left via 412-2 and the second coil second right via 412-4. The second inductor second whole turn may include, for example, second pair of second coil vias, i.e., the second coil second left via 412-2 and the second coil second right via 412-4, in combination with the second coil second bottom cross-trace 416-2 and the second coil second offset top cross-trace 414-2. The example second inductor coil second whole turn can pass from the top to the bottom of the second coil second left via 412-2, then across and under AX2 through the second coil second bottom cross-trace 416-2 to the bottom of the second coil second right via 412-4. Continuing, the second inductor second whole turn can pass from the bottom to the top of the second coil second right via 412-5, then across and over AX2, through the second coil second offset top cross-trace 414-2.

Referring to FIGS. 4A-4B, the second inductor coil 404 can also include a partial turn (visible, but not separately labeled) in series with the above-described second inductor coil first whole turn and second inductor coil second whole turn second whole. This partial turn, may be termed a "second inductor coil partial turn" (visible, but not separately labeled). The second inductor partial turn can include a third pair of second coil vias 412, immediately adjacent (in the direction of AX2) the pair of second coil vias 412 described as structure for the second coil second whole turn. The third pair of second coil vias may comprise, for example, the second coil third left via 412-3 and the second coil third right via 412-6. The second inductor coil partial turn may include, for example, the third pair of second coil vias, i.e., the second coil third left via 412-3 and the second coil third right via 412-6, and the second coil third bottom cross-trace 412-3. The example second inductor coil partial turn can pass from the top to the bottom of the second coil third left via 412-3, then across and under AX2 through the second coil third bottom cross-trace 416-3 to the bottom of, and then upward to the top of the second coil third right via 412-6.

Figure 5A:
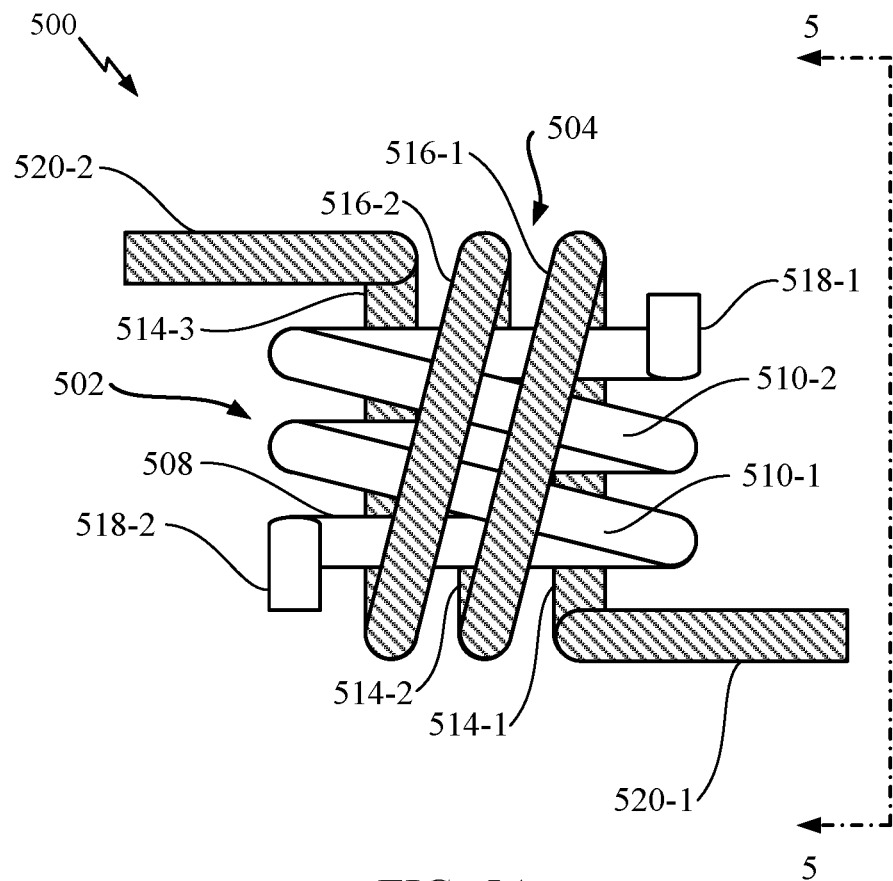
FIG. 5A is a top view, with a substrate rendered transparent for visibility, of one example orthogonal superposed 3D inductor pair according to one or more alternative embodiments, having a reversed metallization aspect.
Figure 5B:
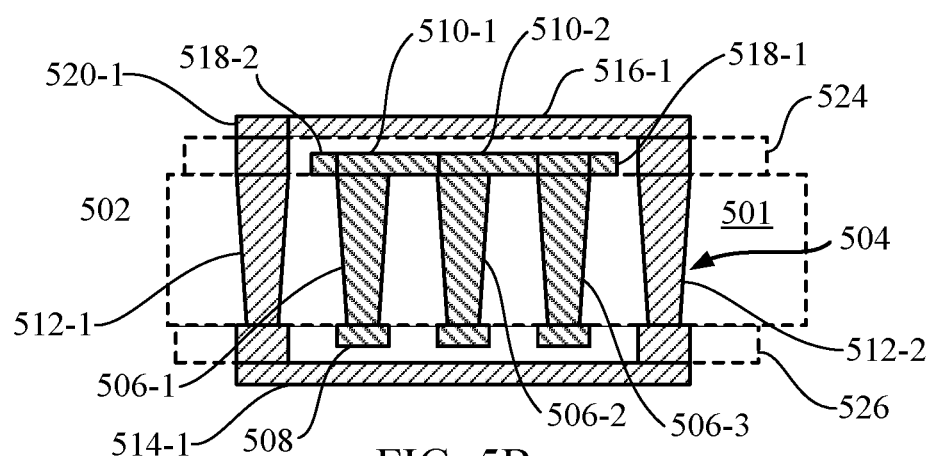
FIG. 5B is a side projection view, on the FIG. 5A projection plane 5-5, of the FIG. 5A example orthogonal superposed 3D inductor pair according to one or more alternative embodiments.

FIG. 5A is a top view, with a substrate rendered transparent for visibility, of one example orthogonal superposed 3D inductor pair 500 according to one or more alternative embodiments. The orthogonal superposed 3D inductor pair 500 can include a first inductor coil 502 in a superposed, orthogonal arrangement with a second inductor coil 504. FIG. 5B is a side projection view, on the FIG. 5A projection plane 5-5, of the FIG. 5A example orthogonal superposed 3D inductor pair 500, showing by dotted line a substrate 501 having a substrate top surface 501T and a substrate bottom surface 501B. It will be understood that "top" and "bottom," in this context, are arbitrarily assigned names that do not define or limit orientation with respect to any external reference system.

Referring to FIGS. 5A and 5B together, structure of the first inductor coil 502 can include six first coil vias, three of which, namely, 506-1, 506-2 and 506-3—are visible on FIG. 5B. The vias 506-1, 506-2 and 506-3 can have structure and an arrangement substantially the same as the first coil first left via 406-1, first coil second left via 406-2 and first coil third left via 406-3 described in reference to FIGS. 4A-4D. The first inductor coil 502 may also include three vias (not visible in FIGS. 5A-5B) having a structure and an arrangement substantially the same as the first coil first right via 406-4, first coil second right via 406-5 and first coil third right via 406-6 described in reference to FIGS. 4A-4D. Referring to FIGS. 5A and 5B, the first inductor coil 502 can further include three first coil bottom cross traces, of which a representative one is labeled 508, and two first coil top offset cross traces, labeled 510-1 and 510-2.

With continuing reference to FIGS. 5A and 5B, the second inductor coil 504 can include six vias, of which two, namely, vias 512-1 and 512-2, are visible. The vias can have structure and an arrangement substantially the same as the second coil first left via 412-1 and second coil first right left via 412-4 described in reference to FIGS. 4A-4D. The second inductor coil 504 may also include 4 addition vias (not visible in FIGS. 5A-5B) having a structure and an arrangement substantially the same as the second coil second left via 412-2, second coil second right via 412-5, second coil third left via 412-3 and second coil third right via 412-6 described in reference to FIGS. 4A-4D.

Referring to FIGS. 5A-5B, the second inductor coil 504 can further include three second coil bottom cross traces, labeled 514-1, 514-2 and 514-3, and two second coil top offset cross traces, labeled 516-1 and 516-2.

With continuing reference to FIGS. 5A-5B, a first inductor first port 518-1 may couple to the top of first coil first left via 506-1 and a first inductor second port 518-1 may couple to the top of another of the six first coil vias (not explicitly visible, obstructed in FIG. 5B by the first coil via 506-1). The first inductor first port 518-1 and the first inductor second port 518-2 are illustrated with shortened length to assist visibility. A second inductor first port 520-1 may couple to the top of second coil via 512-1 and a second inductor second port 520-2 may couple to the top of another of the six second coil vias (not explicitly visible, obstructed in FIG. 5B by the second coil via 512-1).

Referring to FIG. 5B, the top offset cross traces 510-1 and 510-2 of the first inductor coil 502 may be disposed on the top surface 501T of the substrate 501. A top insulating film 524 (alternatively referred to as "top dielectric layer") illustrated transparent as dotted lines, may be disposed above the top offset cross traces 510-1 and 510-2. The top offset cross traces 516-1 and 516-2 of the second inductor coil 504 may be disposed on the top insulating film 524. The bottom cross traces (of which a representative one is labeled 508) of the first inductor coil 502 may be disposed on the bottom surface 501B of the substrate 501. A bottom insulating film (or "bottom dielectric layer," not explicitly visible in FIGS. 5A and 5B) may be disposed above the bottom cross traces (of which a representative one is labeled 508) of the first inductor coil 502. It will be understood that "above," in the context of "disposed above the bottom cross traces (of which a representative one is labeled 508) of the first inductor coil 502," means spaced further from the bottom surface 501B of the substrate 501. The bottom cross traces 514-1, 514-2 and 514-3 of the second inductor coil 504 may be disposed on the second dielectric film 526.

Figure 6A:
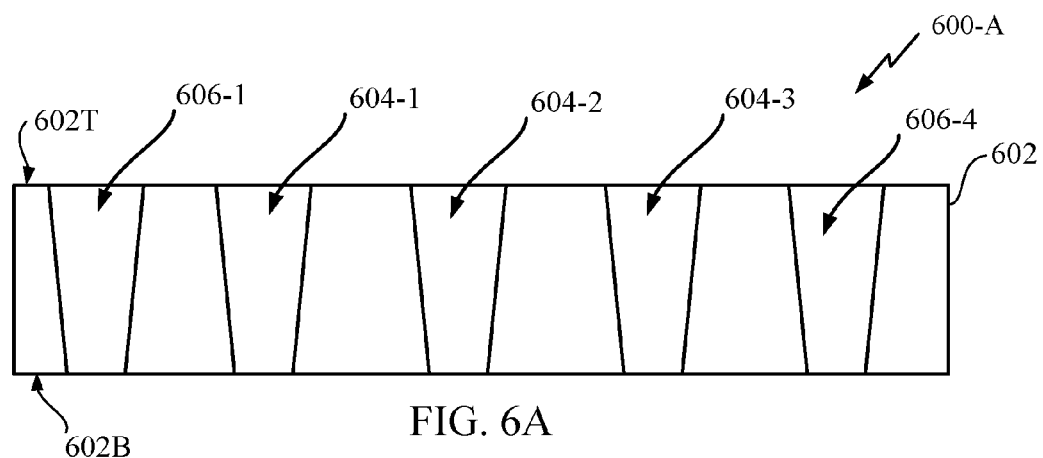
FIGS. 6A-6K represent a snapshot sequence of example operations in one fabrication process, according to one or more exemplary embodiments, in forming the FIG. 5A-5B orthogonal superposed 3D inductor pair, and that may be used in forming other example orthogonal superposed 3D inductor pairs according to one or more embodiments.
Figure 6B:
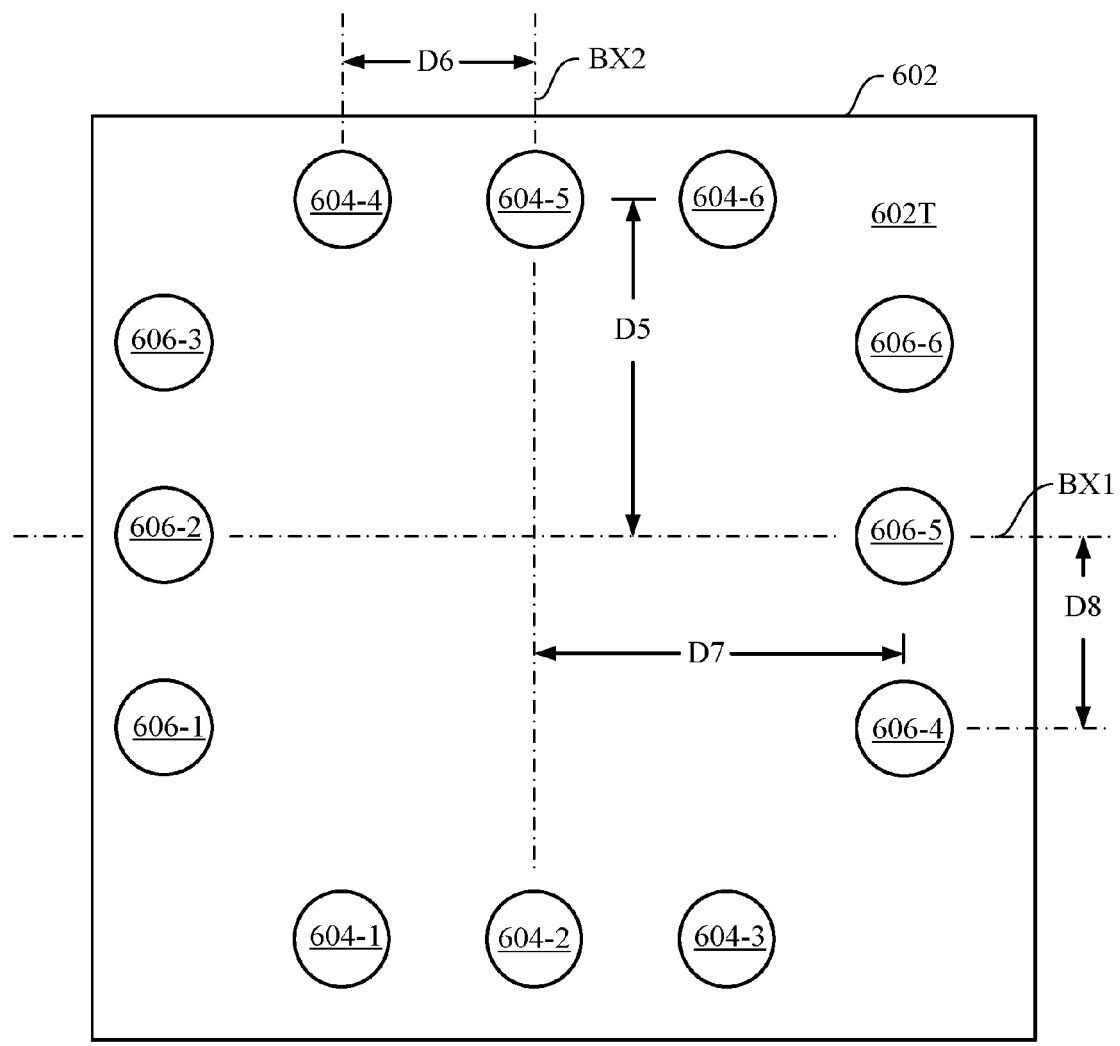

FIGS. 6A-6K represent a snapshot sequence of example operations in one fabrication process, according to one or more exemplary embodiments. The described example operations may be applied in processes for forming, for example, the FIG. 5A-5B orthogonal superposed 3D inductor pair, and for forming other example orthogonal superposed 3D inductor pairs according to one or more embodiments. FIG. 6A and FIGS. 6C-6K illustrate example operations seen from the perspective of the FIG. 5A projection 5-5. FIG. 6B is a top plan view, from the FIG. 6A projection 7-7.

Referring to FIGS. 6A and 6B, one starting structure 600A can include a substrate 602 having a substrate top surface 602T and a substrate bottom surface 602B. The substrate top surface 602T can form, for example, the FIG. 5B substrate top surface 501T. The FIG. 6A substrate bottom surface 602B can form, for example, the FIG. 5B substrate bottom surface 501B. Referring to FIGS. 6A and 6B, operations forming the starting structure 600A can include forming a plurality of pairs of first coil via through holes, such as the example three pair of first coil via through holes, labeled 604-1, 604-2, 604-3, 604-4, 604-5 and 604-6, and collectively referred to as "first coil via through holes" 604.

Operations forming the starting structure 600A can also include forming a plurality of pairs of second via through holes, such as the example three pair of second coil via through holes, labeled 606-1, 606-2, 606-3, 606-4, 606-5 and 606-6, and collectively referred to as "second via through holes" 606.

Referring to FIG. 6B, in an aspect, the first coil via through holes 604 can be positioned relative to a first coil winding axis BX1 projected onto the substrate top surface 602T, and the second coil via through holes 606 can be positioned relative to a second coil winding axis BX2 projected onto the substrate top surface 602T. In an aspect, the first coil winding axis BX1 may be orthogonal to the second coil winding axis BX2. In an aspect, the first coil via through holes 604 can be positioned as pairs of via through holes, each pair having a left via through hole and a right via through hole, displaced D4 symmetrically about the first coil winding axis BX1. The first coil via through holes 604 can be spaced apart along the first coil winding axis BX1 by a first pitch D5. For purposes of illustration, the displacement may be the first coil horizontal winding radius D2 described in reference to FIGS. 4A-4D. In a similar aspect, the second coil via through holes 606 can be positioned as pairs of vias, each pair having a left via and a right via, displaced by D6 symmetrically about the second coil winding axis BX2. For like purposes of illustration, the displacement D6 may be the second coil horizontal winding radius D4 described in reference to FIGS. 4A-4D. The second coil via through holes 606 can be spaced apart along the second coil winding axis BX2 by a second pitch D7.

Figure 6C:
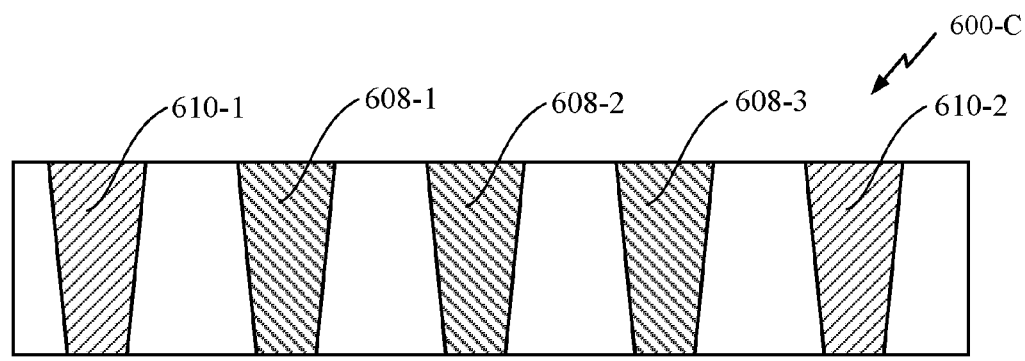

Next, referring to FIG. 6C, a via fill step can fill the above-described six first coil via through holes 604 and six second coil via through holes 606 with metal. The filling with metal can form six vias that will form, in later operations, portions of a first inductor coil (not visible in FIG. 6C), and can form six vias that will form portions of a second inductor coil. For convenience in description, the six vias that will form, in later operations, portions of a first inductor coil will be referenced generically as "first coil vias." Likewise, the six vias that will form, in later operations, portions of a second inductor coil will be referenced generically as "second coil vias." Only three of the six first coil vias, labeled 608-1, 608-2 and 608-3 on FIG. 6C, are visible in that figure, because the projection on which it is viewed results in obstructing the view of the remaining three. Similarly, only two of the six second coil vias, labeled 610-1 and 610-2, are visible in FIG. 6C, as these two obstruct the view of the remaining four. The fill metal forming the six first coil vias and six of the second coil vias can be, for example, Cu. It will be understood that Cu is only one example metal that may be employed, and is not intended to limit the scope of any embodiment or aspect. Conventional techniques for metal fill of via through holes can be used. Such conventional metal fill techniques are known to persons of ordinary skill in the art. Therefore, further detailed description of operations in filling the above-described six first coil via through holes 604 and the six second coil via through holes 606 is omitted.

Figure 6D:
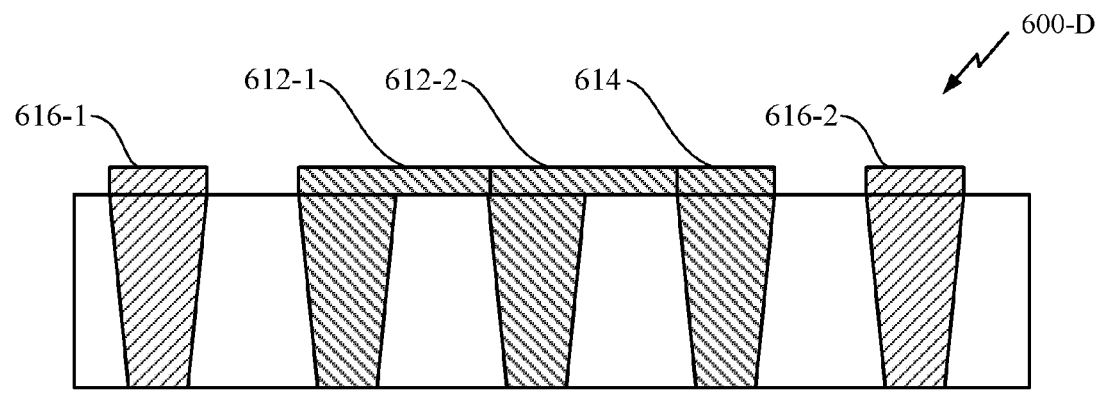

Next, referring to FIG. 6D, a top first metallization can include two first coil top offset cross traces 612-1 and 612-2 on the substrate top surface 602T. The top first metallization can also form first coil via top pads 614-1 and 614-2 on the second coil vias 610-1 and 610-2, and via top pads (obstructed from view) on the remaining four second coil vias. The two top offset cross traces 612-1 and 612-2 can provide portions of a first turn and a second turn, respectively (not visible in FIG. 6D), of a first inductor coil, such as the first inductor coil 502 of FIGS. 5A-5B. Metals that may be used for the top first layer metallization include, for example, Cu. It will be understood that Cu is only one example, and is not intended to limit the scope of any embodiment or aspect. Conventional techniques for metallization may be used for the top first layer metallization, and such techniques are known to persons of ordinary skill in the art and, therefore, further detailed description is omitted.

Figure 6E:
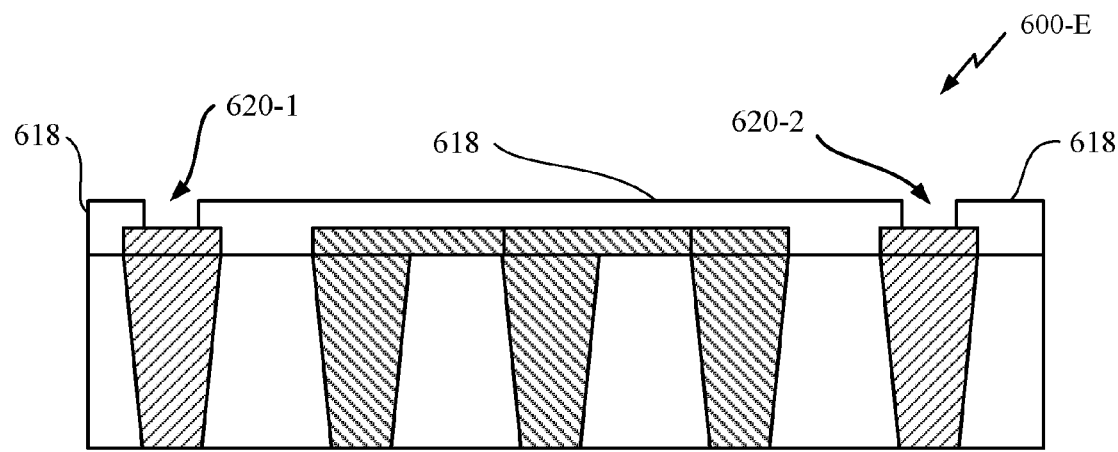

Next, referring to FIG. 6E, a first top insulating film 618 (which may also be referred to as "a first top dielectric layer" 618) can be deposited above the first top metallization. The first top dielectric layer 618 therefore can cover the two top offset cross traces 612-1 and 612-2 and cover the via top pads of the six second coil vias, e.g., over top pads 616-1 and 616-2. Clearances may be etched in the first top dielectric layer 618 to expose the via top pads of the six second coil vias, e.g., via top pads 616-1 and 616-2, thereby forming in-process structure 600-E. Referring to FIG. 6E, the etching to expose the via top pads of the six second coil vias can form recesses such as the example recesses 620-1 and 620-2. The first top dielectric layer 618 may be formed of, for example, silicon dioxide. It will be understood that silicon dioxide is only one example, and is not intended to limit the scope of any embodiment or aspect. Conventional techniques for forming or depositing a dielectric layer, and conventional techniques for etching a dielectric layer to expose underlying top pads and landing pads may be used. Such techniques are known to persons of ordinary skill in the art and, therefore, further detailed description is omitted.

Figure 6F:
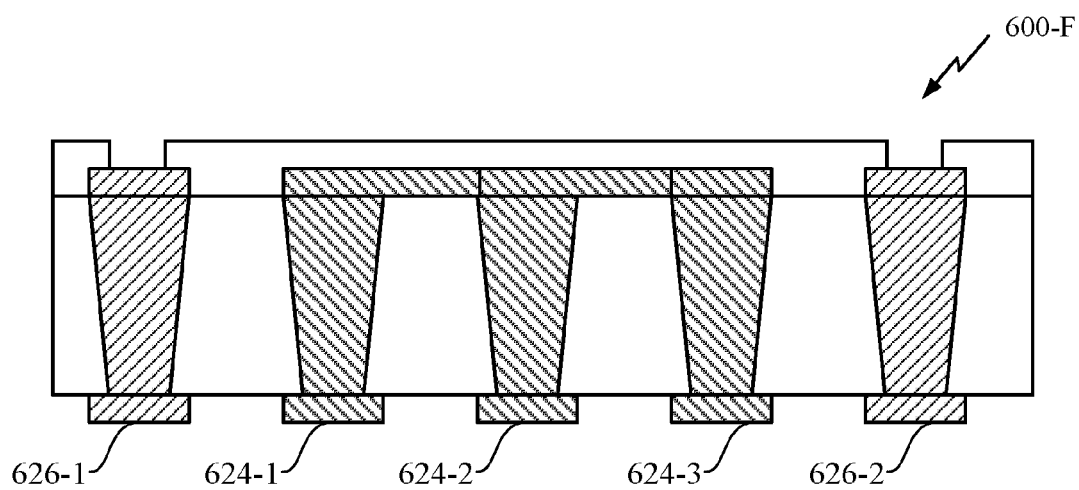

Next, referring to FIG. 6F, a bottom first metallization on the substrate bottom surface 602B can form first inductor coil bottom cross traces 624-1, 624-2 and 624-3. The bottom first metallization can also form via bottom pads 626-1 and 626-2 on the bottom (visible but not separately numbered) of second coil vias 610-1 and 610-2, and via bottom pads (obstructed from view) on the bottom of the remaining four of the second coil vias. The first inductor coil bottom cross traces 624-1, 624-2 and 624-3 can each connect at a proximal end, which is visible in FIG. 6F, to a bottom of a respective one of the first coil vias 606-1, 606-2 and 606-3. The first inductor coil bottom cross traces 624-1, 624-2 and 624-3 can each extend into the plane of the figure a horizontal pitch distance to a respective distal end (not visible in FIG. 6F). The distal end of the first inductor coil bottom cross trace 624-1 can connect to a via bottom (obstructed from view) of another of the six first coil vias (obstructed from view) that form portions of the first inductor coil. Likewise, the distal ends of the first inductor coil bottom cross traces 624-2 and 624-3 can each connect to a via bottom (obstructed from view) of another of the six first coil vias (obstructed from view). Metals that may be used for the bottom first metallization include, for example, Cu. It will be understood that Cu is only one example, and is not intended to limit the scope of any embodiment or aspect. Conventional techniques for metallization may be used for the bottom first layer metallization, and such techniques are known to persons of ordinary skill in the art and, therefore, further detailed description is omitted.

Figure 6G:
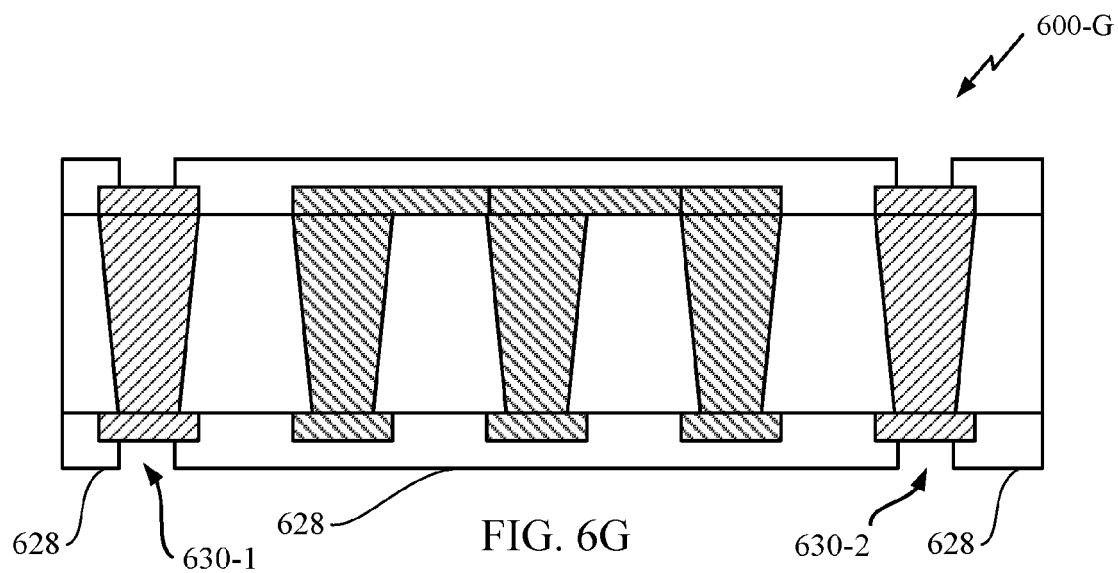

Next, referring to FIG. 6G, a first bottom insulating film 628 (which may also be referred to as "a first bottom dielectric layer 628") can be deposited on the first inductor coil bottom cross traces 624-1, 624-2 and 624-3, and over the via bottom pads of the six second coil vias. Regions of the first bottom dielectric layer 628 may then be etched to expose the via bottom pads of the six vias that form respective portions of the second inductor coil, such as the via bottom pads 626-1 and 626-2, thereby forming in-process structure 600-G. Referring to FIG. 6G, the etching to expose the via bottom pads of the six vias that form respective portions of the second inductor coil can form recesses such as the example recesses 630-1 and 630-2. The first bottom dielectric layer 628 may be formed of, for example, silicon dioxide. It will be understood that silicon dioxide is only one example, and is not intended to limit the scope of any embodiment or aspect. Conventional techniques for forming or depositing a dielectric layer, and conventional techniques for etching a dielectric layer to expose underlying via pads and landing pads may be used. Such techniques are known to persons of ordinary skill in the art and, therefore, further detailed description is omitted.

Figure 6H:
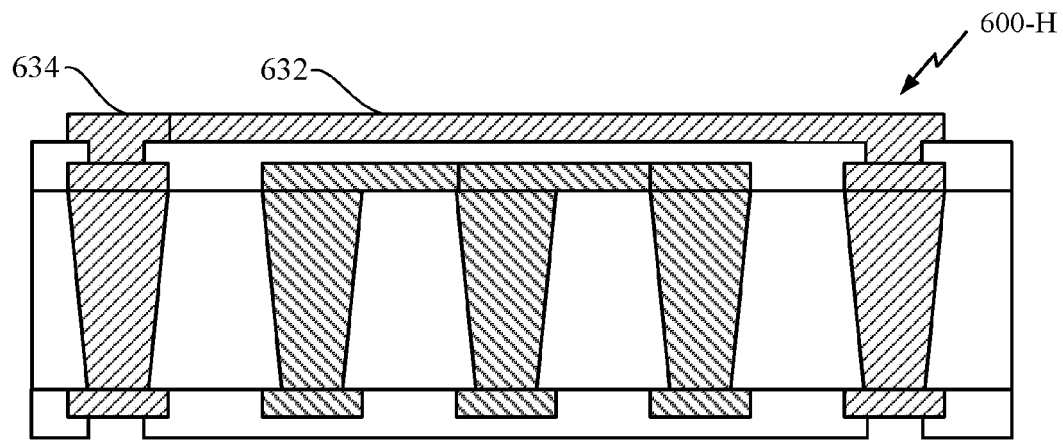

Next, referring to FIG. 6H, a top second metallization can form on the first top dielectric layer 618 the top offset cross trace 632 and another top offset cross trace (obstructed from view). The top offset cross trace 632 and other the top offset cross trace (obstructed from view) formed by the top second metallization can form, for example, the top offset cross traces 516-1 and 516-2 of FIGS. 5A and 5B. The top second metallization can also form a first port 634 that connects to one end of the second inductor coil and a second port (obstructed from view) that connects to the end of the second inductor coil, thereby forming in-process structure 600-H. The first port 634 and the other port (obstructed from view) formed by the top second metallization can form, for example, the second inductor first port 520-1 and the second inductor second port 520-2 of FIGS. 5A and 5B. Metals that may be used for the top second metallization include, for example, Cu. It will be understood that Cu is only one example, and is not intended to limit the scope of any embodiment or aspect. Conventional techniques for metallization may be used for the top second metallization, and such techniques are known to persons of ordinary skill in the art and, therefore, further detailed description is omitted.

Figure 6I:
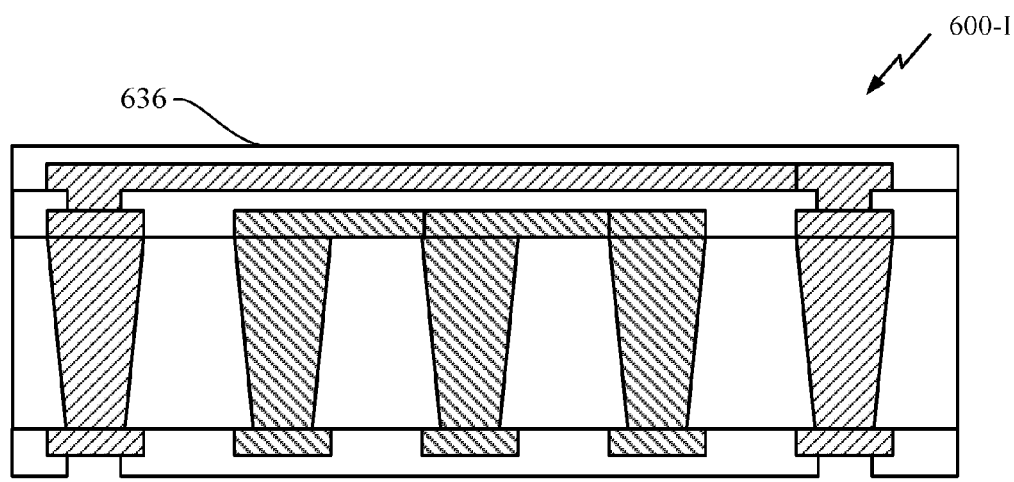

Next, referring to FIG. 6I, a second top dielectric layer 636 can be deposited on the top offset cross trace 632 and on the other top offset cross trace), on the first port 634 that connects to one end of the second inductor coil, and on the second port that connects to the other end of the second inductor coil. The second top dielectric layer 636 may be formed of, for example, silicon dioxide. It will be understood that silicon dioxide is only one example, and is not intended to limit the scope of any embodiment or aspect. Conventional techniques for forming or depositing a dielectric layer may be used. Such techniques are known to persons of ordinary skill in the art and, therefore, further detailed description is omitted.

Figure 6J:
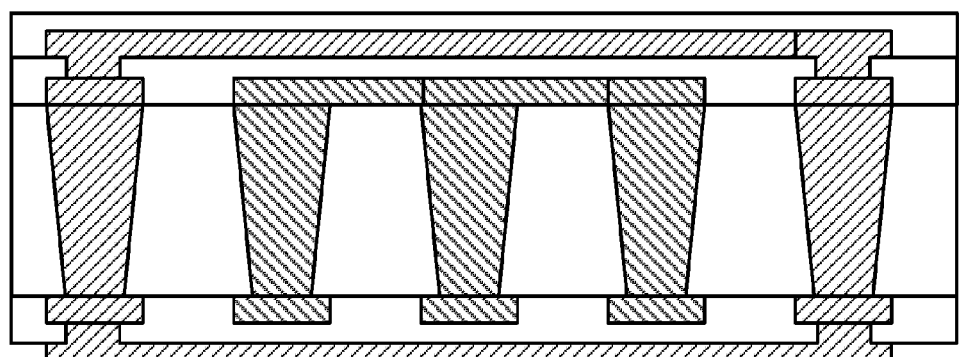

Next, referring to FIG. 6J, a bottom second metallization can form, on the first bottom dielectric layer 628, the bottom cross trace 638 and two other bottom cross traces (obstructed from view). The bottom cross trace 638 and the other two of the bottom cross traces formed by the bottom second metallization can form, for example, the bottom cross traces 514-1, 514-2 and 514-3 of FIGS. 5A and 5B. Metals that may be used for the bottom second metallization include, for example, Cu. It will be understood that Cu is only one example, and is not intended to limit the scope of any embodiment or aspect. Conventional techniques for metallization may be used for the bottom second metallization, and such techniques are known to persons of ordinary skill in the art and, therefore, further detailed description is omitted.

Figure 6K:
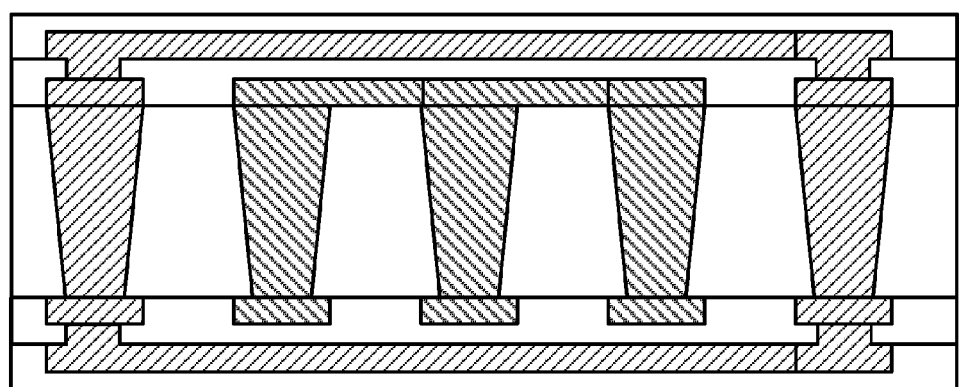

Next, referring to FIG. 6K, a second bottom dielectric layer 640 can be deposited on the bottom cross trace 638 and on the two other bottom cross traces. The second bottom dielectric layer 640 may be formed of, for example, silicon dioxide. It will be understood that silicon dioxide is only one example, and is not intended to limit the scope of any embodiment or aspect. Conventional techniques for forming or depositing a dielectric layer may be used. Such techniques are known to persons of ordinary skill in the art and, therefore, further detailed description is omitted.

Figure 7:
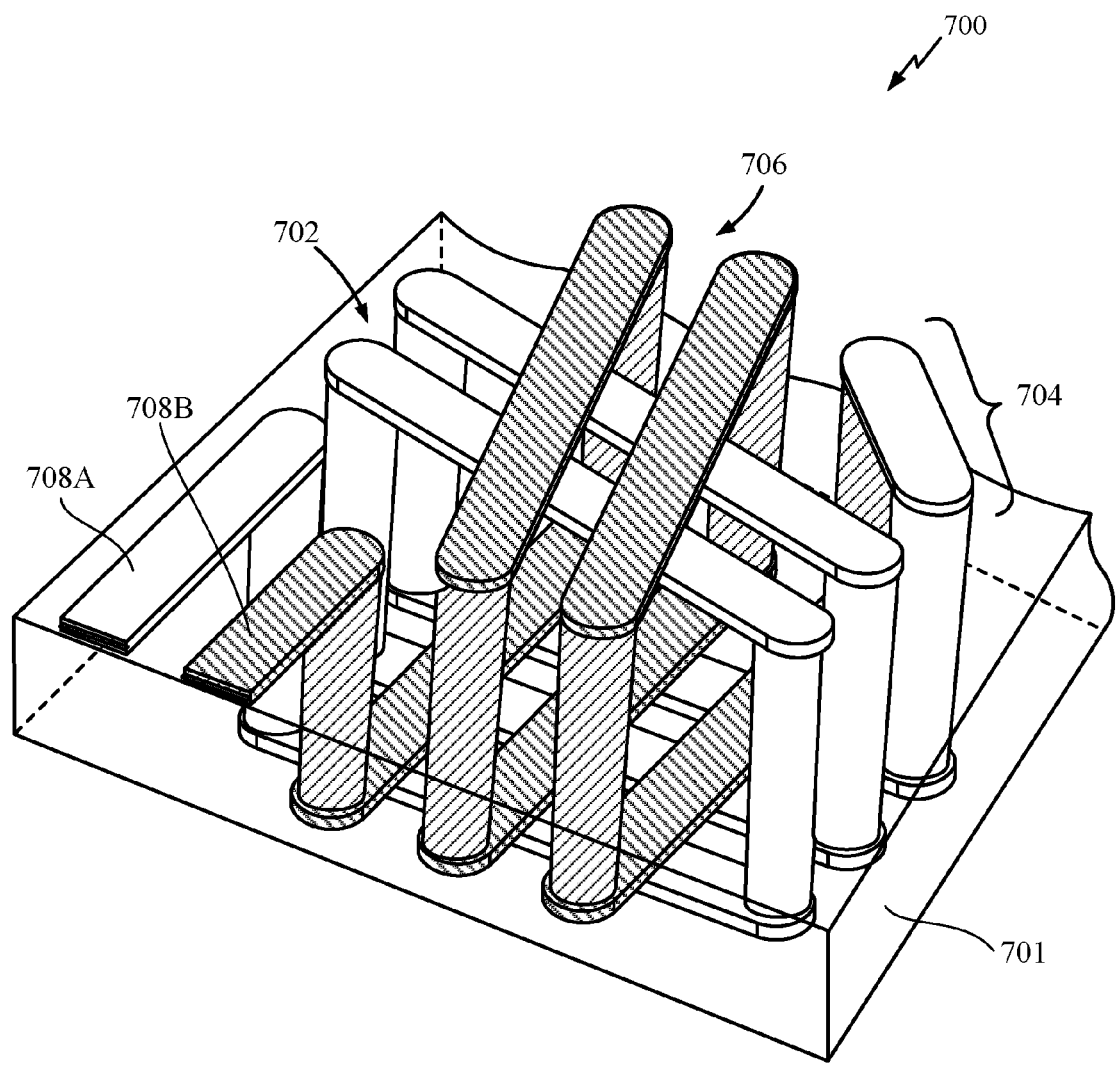
FIG. 7 is a perspective view, with a substrate rendered transparent for visibility, of one example 3D superposed half-volume compacted inductor according to one or more exemplary embodiments.

FIG. 7 is a perspective view, with a substrate rendered transparent for visibility, of one example 3D superposed half-volume compacted inductor 700 according to one or more exemplary embodiments. Referring to FIG. 7, the 3D superposed half-volume compacted inductor 700 may include a first inductor section 702, which may be structured substantially the same as the first inductor coil 402 of FIG. 4A-4D connected in series, through a series connection 704, to a second inductor section 706. The second inductor section 706 may be structured substantially the same as the second inductor coil 404 of FIGS. 4A-4D. In an aspect, the 3D superposed half-volume compacted inductor 700 may be configured to have a first port 708A and a second port 708B on proximal to one another on the same lateral side of the inductor structure.

Figure 8:
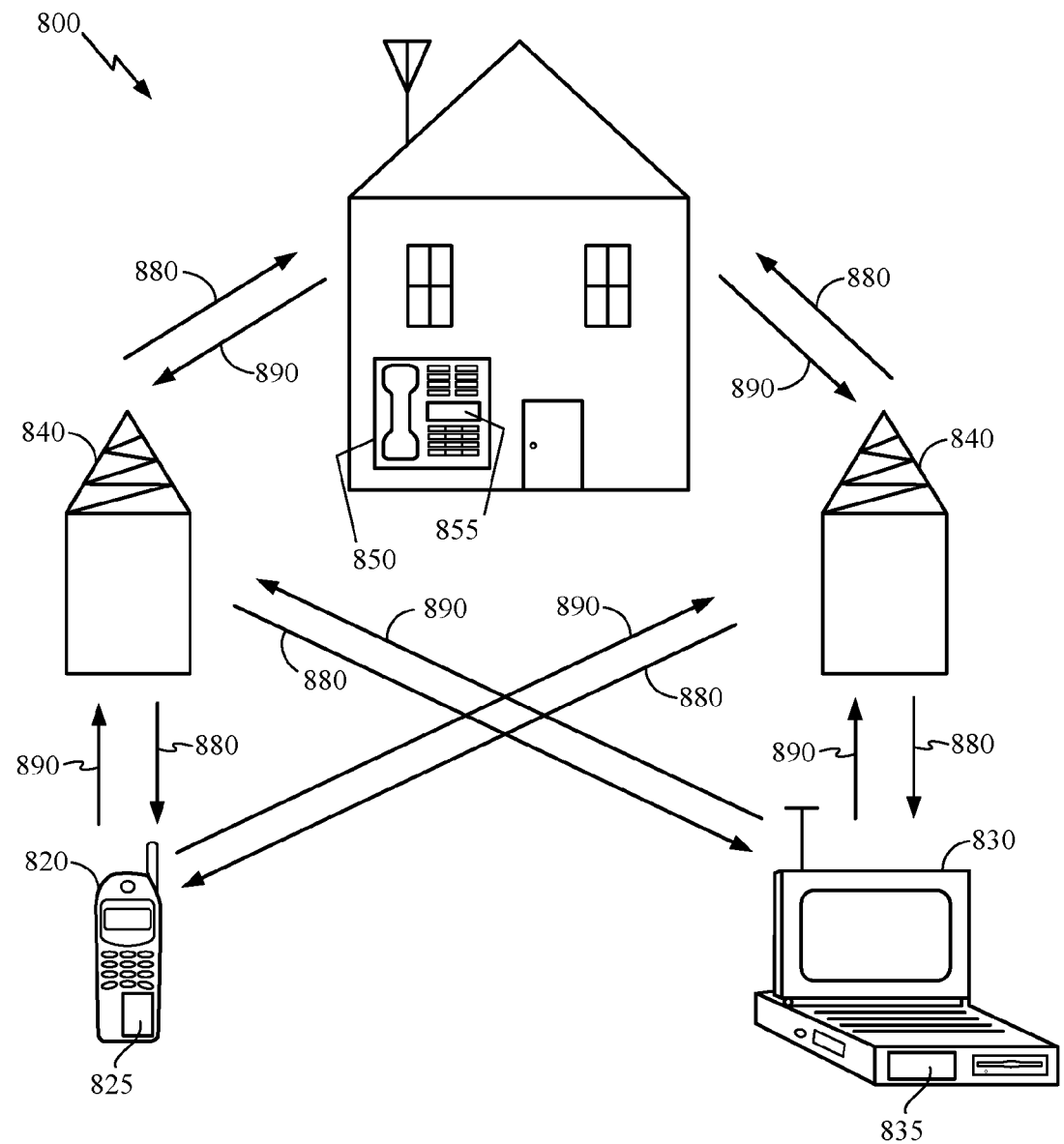
FIG. 8 shows one example functional schematic of one example personal communication and computing device in accordance with one or more exemplary embodiments.

FIG. 8 illustrates an exemplary communication system 800 in which one or more embodiments of the disclosure, e.g., as described in reference to any one or more of FIGS. 4A-4D, 5A, 5B or 7. For purposes of illustration, FIG. 8 shows three remote units 820, 830, and 850 and two base stations 840. It will be recognized that conventional wireless communication systems may have many more remote units and/or base stations than are visible in FIG. 8. The remote units 820, 830, and 850 include integrated circuit or other semiconductor devices 825, 835 and 855 having one or more pillar inductors in accordance with one or more of the disclosed exemplary embodiments, e.g., as described in reference to any one or more of FIGS. 4A-4D or FIG. 6. FIG. 8 shows forward link signals 880 from the base stations 840 and the remote units 820, 830, and 850, and shows reverse link signals 890 from the remote units 820, 830, and 850 to the base stations 840.

In FIG. 8, the remote unit 820 is shown as a mobile telephone, the remote unit 830 is shown as a portable computer, and the remote unit 850 is shown as a fixed location remote unit in a wireless local loop system. These are only examples, both in terms of quantity and type. For example, the remote units 820, 830 and 850 may be one of, or any combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 8 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

The foregoing disclosed devices and functionalities, e.g., as described in reference to any one or more of FIG. 4A-4D or 6, may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof Further, those of skill in the art will appreciate that the various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for forming a three-dimensional inductor pair, comprising:
   providing a substrate, wherein the substrate has a substrate top surface and a substrate bottom surface;
   forming in the substrate, in an alignment with a winding section of a first winding axis, a plurality of pairs of first coil via through holes, wherein each pair of first coil via through holes comprises two via through holes spaced symmetrically from the first winding axis by a first horizontal winding radius;
   forming in the substrate, in an alignment with a winding section of a second winding axis, a plurality of pairs of second coil via through holes, wherein each pair of second coil via through holes comprises two via through holes spaced symmetrically from the first winding axis by a second horizontal winding radius, wherein the first winding axis is orthogonal to the second winding axis, wherein the first winding axis intersects the second winding axis at an intersection point, and wherein the intersection point is concurrently within the winding section of the first winding axis and the winding section of the second winding axis;

filling the plurality of pairs of first coil via through holes and the plurality of pairs of second via through holes with metal to form, respectively, a plurality of pairs of first coil vias, and a plurality of pairs of second coil vias;

forming a first top metallization, wherein the first top metallization is on the substrate top surface, wherein the first top metallization includes a first coil top offset cross trace, wherein the first coil top offset cross trace is arranged to pass over the first winding axis and to couple a top of a first via of a first pair of first coil vias to a top of a first via of a second pair of first coil vias;

forming a first bottom metallization, wherein the first bottom metallization is on the substrate bottom surface, wherein the first bottom metallization includes a second coil bottom cross trace, wherein the second coil bottom cross trace is arranged to pass under the second winding axis and to couple a bottom of a first via of a first pair of second coil vias to a bottom of the second via of the first pair of second coil vias;

forming a second top metallization, wherein the second top metallization is on the substrate top surface, wherein the second top metallization includes a second coil top offset cross trace, wherein the second coil top offset cross trace is arranged to pass over the second winding axis and over the first coil top offset cross trace and to couple a top of the second via of the first pair of second coil vias to a top of a first via of a second pair of second coil vias; and forming a second bottom metallization, wherein the second bottom metallization is on the substrate bottom surface, wherein the second bottom metallization includes a first coil bottom cross trace, wherein the first coil bottom cross trace is arranged to pass under the first winding axis and to couple a bottom of a second via of the first pair of first coil vias to a bottom of the first via of the first pair of first coil vias.

2. The method of claim 1, further comprising:

forming a top dielectric layer, wherein the top dielectric layer is over the first top metallization;

etching clearances through the top dielectric layer, wherein the clearances through the top dielectric layer are located and dimensioned to expose the top of the first via of the first pair of second coil vias and to expose the top of the first via of the second pair of second coil vias;

forming a bottom dielectric layer, wherein the bottom dielectric layer is over the first bottom metallization; and etching clearances through the bottom dielectric layer, wherein the clearances through the bottom dielectric layer are located and dimensioned to expose the bottom of the second via of the first pair of second coil vias and to expose the bottom of the first via of the first pair of second coil vias.

3. The method of claim 1, wherein the first top metallization includes a first inductor first port and a first inductor second port, and wherein the first inductor first port is coupled to the top of the second via of the first pair of first coil vias and the first inductor second port is coupled to the top of the first via of the second pair of first coil vias.

4. The method of claim 1, wherein the first coil top offset cross trace is a first coil first top offset cross trace, and the first coil bottom cross trace is a first coil first bottom cross trace, wherein the first top metallization further includes a first coil second top offset cross trace, wherein the first coil second top offset cross trace is arranged to pass over the first winding axis and to couple a top of the second via of the second pair of first coil vias to a top of a first via of a third pair of first coil vias, wherein the first bottom metallization further includes a second coil second bottom cross trace and a second coil third bottom cross trace, wherein the second coil second bottom cross trace is arranged to pass under the second winding axis and to couple a bottom of the first via of the second pair of second coil vias to a bottom of a second via of the second pair of second coil vias, and wherein the second coil third bottom cross trace is arranged to pass under the second winding axis and to couple a bottom of a first via of a third pair of second coil vias to a bottom of a second via of the third pair of second coil vias.

5. The method of claim 4, wherein the second coil top offset cross trace is a second coil first top offset cross trace, the second coil bottom cross trace is a second coil first bottom cross trace, wherein the second top metallization further includes a second coil second top offset cross trace, wherein the second coil second top offset cross trace is arranged to pass over the second winding axis and to couple a top of the second via of the second pair of second coil vias to a top of a first via of a third pair of second coil vias, wherein the second bottom metallization further includes a first coil second bottom cross trace and a first coil third bottom cross trace, wherein the first coil second bottom cross trace is arranged to pass under the first winding axis and to couple a bottom of the first via of the second pair of first coil vias to a bottom of the second via of the second pair of first coil vias, and wherein the first coil third bottom cross trace is arranged to pass under the first winding axis and to couple a bottom of the first via of the third pair of first coil vias to a bottom of a second via of the third pair of first coil vias.

6. A method for forming a three-dimensional inductor pair, comprising providing a substrate, wherein the substrate has a substrate top surface and a substrate bottom surface;

forming in the substrate, in an alignment with a winding section of a first winding axis, a plurality of pairs of first coil via through holes, wherein each pair of first coil via through holes comprises two via through holes spaced symmetrically from the first winding axis by a first horizontal winding radius;

forming in the substrate, in an alignment with a winding section of a second winding axis, a plurality of pairs of second coil via through holes, wherein each pair of second coil via through holes comprises two via through holes spaced symmetrically from the second winding axis by a second horizontal winding radius, wherein the first winding axis is orthogonal to the second winding axis, wherein the first winding axis intersects the second winding axis at an intersection point, and wherein the intersection point is concurrently within the winding section of the first winding axis and the winding section of the second winding axis;

filling the plurality of pairs of first coil via through holes and the plurality of pairs of second coil via through holes with metal to form, respectively, a plurality of pairs of first coil vias, and a plurality of pairs of second coil vias;

forming a first top metallization, wherein the first top metallization is on the substrate top surface, wherein the first top metallization includes a first coil top offset cross trace, wherein the first coil top offset cross trace passes over the first winding axis and couples a top of a first via of a first pair of first coil vias to a top of a first via of a second pair of first coil vias;

forming a first bottom metallization, wherein the first bottom metallization is on the substrate bottom surface, wherein the first bottom metallization includes a first coil bottom cross trace, wherein the first coil bottom cross trace passes under the first winding axis and couples a bottom of a second via of the first pair of first coil vias to a bottom of the first via of the first pair of first coil vias;

forming a second top metallization, wherein the second top metallization is on the substrate top surface, wherein the second top metallization includes a second coil top offset cross trace, wherein the second coil top offset cross trace passes over the second winding axis and over the first coil top offset cross trace and couples a top of a first via of a first pair of second coil vias to a top of a first via of a second pair of second coil vias; and forming a second bottom metallization, wherein the second bottom metallization is on the substrate bottom surface, wherein the second bottom metallization includes a second coil bottom cross trace, wherein the second coil bottom cross trace passes under the second winding axis and couples a bottom of a second via of the first pair of second coil vias to a bottom of the first via of the first pair of second coil vias.

7. The method of claim 6, wherein the first coil top offset cross trace is a first coil first top offset cross trace, and the first coil bottom cross trace is a first coil first bottom cross trace, wherein the first top metallization further includes a first coil second top offset cross trace, wherein the first coil second top offset cross trace is arranged to pass over the first winding axis and to couple a top of the via of the second pair of first coil vias to a top of a first via of a third pair of first coil vias, wherein the first bottom metallization further includes a first coil second bottom cross trace and a first coil third bottom cross trace, wherein the first coil second bottom cross trace is arranged to pass under the first winding axis and to couple a bottom of the first via of the second pair of first coil vias to a bottom of a second via of the second pair of first coil vias, and wherein the first coil third bottom cross trace is arranged to pass under the first winding axis and to couple a bottom of the first via of the third pair of first coil vias to a bottom of a second via of the third pair of first coil vias.

* * * * *